(12) United States Patent
Wang et al.

(10) Patent No.: US 10,867,887 B2
(45) Date of Patent: Dec. 15, 2020

(54) ENHANCED FLOW BOILING HEAT TRANSFER IN MICROCHANNELS WITH STRUCTURED SURFACES

(71) Applicant: Massachusetts Institute of Technology, Cambridge, MA (US)

(72) Inventors: Evelyn Wang, Cambridge, MA (US); Yangying Zhu, Cambridge, MA (US); Kuang-Han Chu, Chandler, AZ (US); Dion Savio Antao, Somerville, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/811,811

(22) Filed: Jul. 28, 2015

(65) Prior Publication Data
US 2016/0033212 A1 Feb. 4, 2016

Related U.S. Application Data

(60) Provisional application No. 62/030,258, filed on Jul. 29, 2014.

(51) Int. Cl.
*H01L 23/42* (2006.01)
*H01L 23/427* (2006.01)
*F28D 15/04* (2006.01)
*F28F 13/18* (2006.01)

(52) U.S. Cl.
CPC .......... *H01L 23/427* (2013.01); *F28D 15/046* (2013.01); *F28F 13/187* (2013.01); *F28F 2245/02* (2013.01); *F28F 2245/04* (2013.01); *H01L 2924/0002* (2013.01)

(58) Field of Classification Search
CPC .. H01L 23/473; F28F 2245/02; F28F 2245/04
See application file for complete search history.

(56) References Cited

U.S. PATENT DOCUMENTS

| 7,806,168 | B2 * | 10/2010 | Upadhya | F04B 17/00 165/104.33 |
|---|---|---|---|---|
| 9,147,633 | B2 * | 9/2015 | Eid | H01L 23/3675 |
| 9,711,433 | B2 * | 7/2017 | Taniguchi | H01L 25/0657 |

(Continued)

FOREIGN PATENT DOCUMENTS

WO   2013/184210 A2   12/2013

OTHER PUBLICATIONS

Notification Concerning Transmittal of International Preliminary Report on Patentability (Chapter I of the Patent Cooperation Treaty) dated Feb. 9, 2017, issued in International Application No. PCT/US2015/042509.

(Continued)

*Primary Examiner* — Hung Q Nguyen
(74) *Attorney, Agent, or Firm* — Honigman LLP

(57) ABSTRACT

A two-phase microchannel heat sink can be a fluid channel including a bottom wall including a superhydrophilic surface with microstructures and a side wall including a surface that is hydrophobic relative to the superhydrophilic surface of the bottom wall. When heat flux is applied to the fluid channel, a liquid film on the bottom wall is maintained and nucleation of boiling occurs only on the side wall.

9 Claims, 26 Drawing Sheets

(56) References Cited

U.S. PATENT DOCUMENTS

| | | | | |
|---|---|---|---|---|
| 2002/0117293 | A1* | 8/2002 | Campbell | B01D 1/22 165/133 |
| 2003/0205363 | A1* | 11/2003 | Chu | F28D 15/0266 165/80.3 |
| 2011/0017431 | A1* | 1/2011 | Yang | F28D 15/046 165/104.26 |
| 2011/0120674 | A1* | 5/2011 | MacDonald | F28D 15/046 165/104.26 |
| 2011/0198059 | A1* | 8/2011 | Gavillet | F28D 15/046 165/104.26 |
| 2012/0012804 | A1* | 1/2012 | Chen | F28D 15/0233 257/2 |
| 2012/0052241 | A1* | 3/2012 | King | B08B 17/06 428/141 |
| 2013/0142995 | A1* | 6/2013 | Cho | C03C 17/3411 428/141 |

OTHER PUBLICATIONS

International Search Report dated Jun. 1, 2016, issued in International Application No. PCT/US2015/042509.

Written Opinion of the International Searching Authority dated Jun. 1, 2016, issued in International Application No. PCT/US2015/042509.

Chu Kuang-Han et al: Hierarchically structured surfaces for boiling critical heat flux enhancement , Applied Physics Letters, A I P Publishing LLC, US, vol. 102, No. 15, Apr. 15, 2013 (Apr. 15, 2013), pp. 151602-151602, XP012171924, ISSN: 0003-6951, DOI: 10.1063/1.4801811 (retrieved on Apr. 18, 2013) the whole document.

* cited by examiner

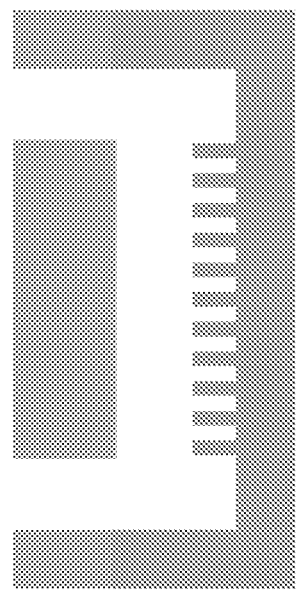
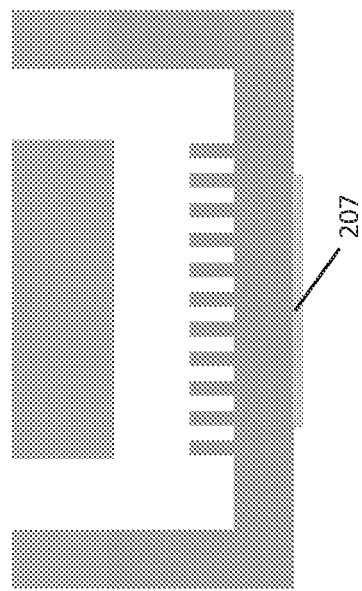
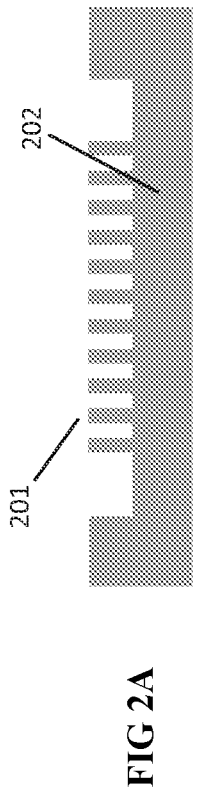
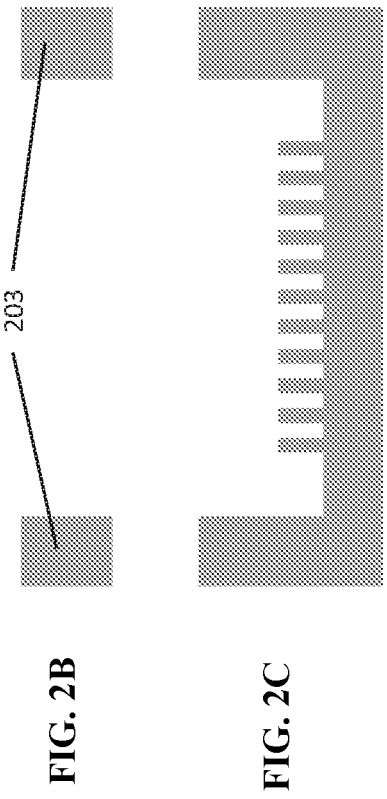
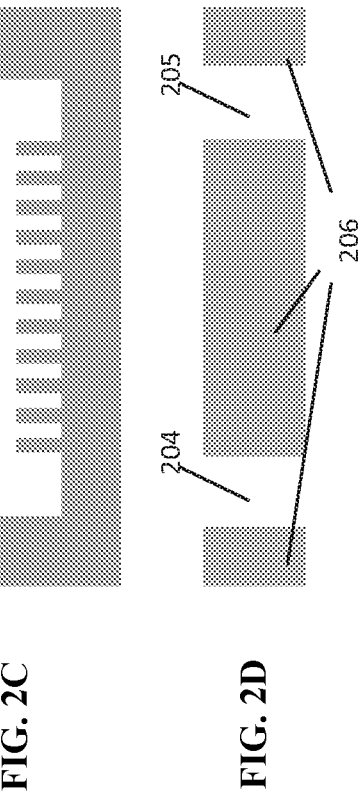
FIG. 2A
FIG. 2B
FIG. 2C
FIG. 2D
FIG. 2E
FIG. 2F

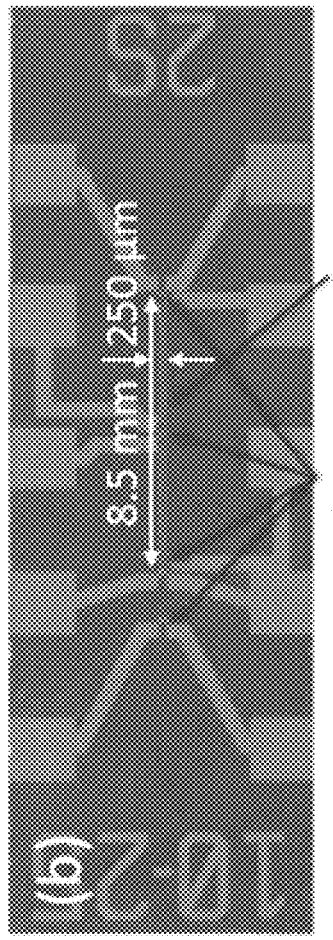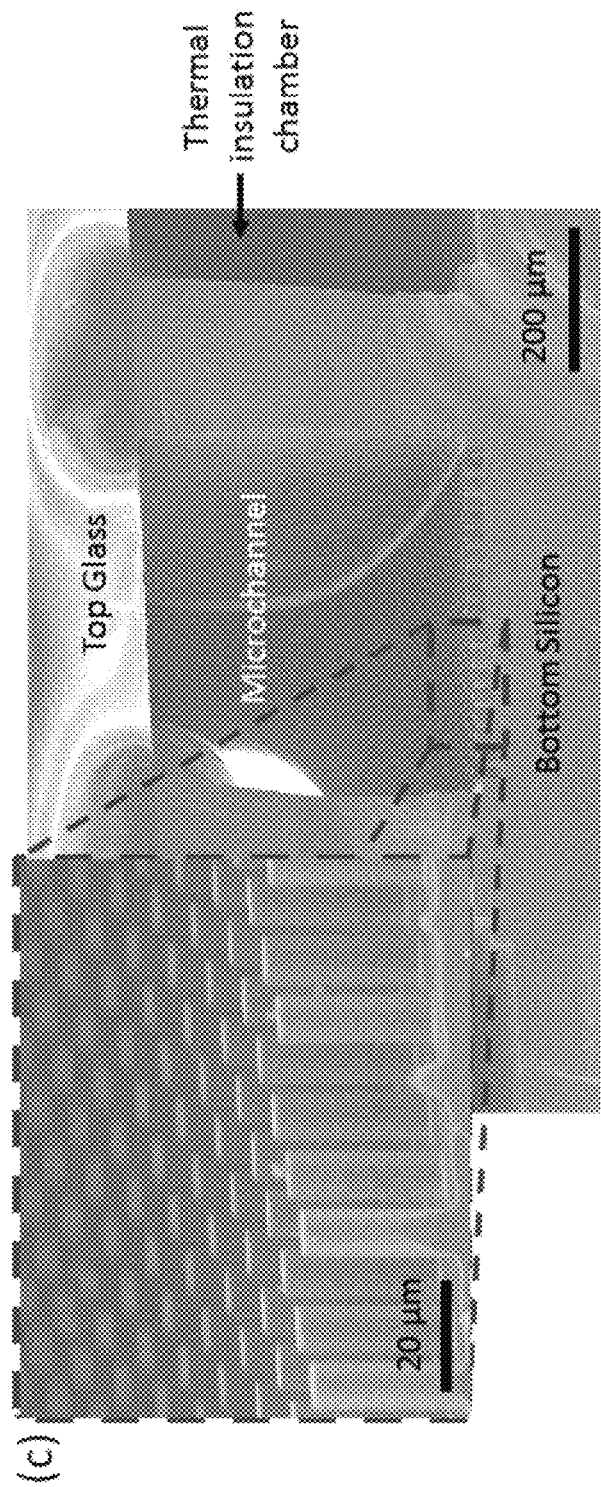
FIG. 3B
FIG. 3C

ENHANCED FLOW BOILING HEAT TRANSFER IN MICROCHANNELS WITH STRUCTURED SURFACES

CLAIM OF PRIORITY

This application claims the benefit of prior U.S. Provisional Application No. 62/030,258 filed on Jul. 29, 2014, which is incorporated by reference in its entirety.

STATEMENT REGARDING FEDERALLY SPONSORED RESEARCH OR DEVELOPMENT

This invention was made with Government support under Grant No. FA9550-11-1-0059 awarded by the U.S. Air Force Office of Scientific Research. The Government has certain rights in the invention.

TECHNICAL FIELD

This invention relates to microstructured surfaces.

BACKGROUND

High performance electronic devices are motivating the need for advanced thermal management strategies. The need for thermal management schemes capable of dissipating high heat fluxes at uniform temperature environments and with low temperature rises has been well-recognized. Two-phase microchannel heat sinks, where the latent heat of vaporization offers an efficient method to dissipate large heat fluxes in a compact device and the large surface to volume ratio provides lower thermal resistance than its macroscale counterpart. However, at length scales where surface tension dominates the shape of an interface (i.e., much lower than the capillary length), the rapid expansion of vapor bubble occupies the space of microchannel before it can depart from the heating surface, leading to large pressure fluctuations in the flow channels and dry out during boiling which severely limits the heat removal efficiency of two-phase microchannel heat sinks.

SUMMARY

A structure for efficient heat transfer can include a fluid channel including a bottom wall, wherein the bottom wall includes a superhydrophilic surface, and a side wall, where the side wall includes a surface that is hydrophobic relative to the superhydrophilic surface of the bottom wall, where when heat flux is applied to the fluid channel, a liquid film on the bottom wall is maintained and nucleation of boiling occurs only on the side wall. The bottom wall can include a plurality of microstructures, such as micropillars. The microchannel can be made of silicon, copper, aluminum, steel or diamond. The fluid channel can further include a hydrophilic material, such as $SiO_2$.

A method of transferring heat can include applying a heat source to a hydrophilic heat transfer region of a device and transferring a heated fluid to a boiling region, wherein the boiling region is hydrophobic relative to the heat transfer region. The heat transfer region comprises a plurality of microstructures, such as micropillars. The microchannel can be made of silicon, copper, aluminum, steel or diamond. The heat transfer region can further include a hydrophilic material, such as silicon dioxide, copper oxide, aluminum oxide, or zinc oxide, to enhance hydrophilicity. The boiling region can further coated with a hydrophobic material, such as Teflon, to further enhance hydrophobicity.

Other aspects, embodiments, and features will be apparent from the following description, the drawings, and the claims.

BRIEF DESCRIPTION OF THE DRAWINGS

FIGS. 2A-2F are schematics of the fabrication process for the microchannels with integrated micropillars.

FIGS. 3A-3C are images and SEM of fabricated microchannel.

DETAILED DESCRIPTION

Figure 1:
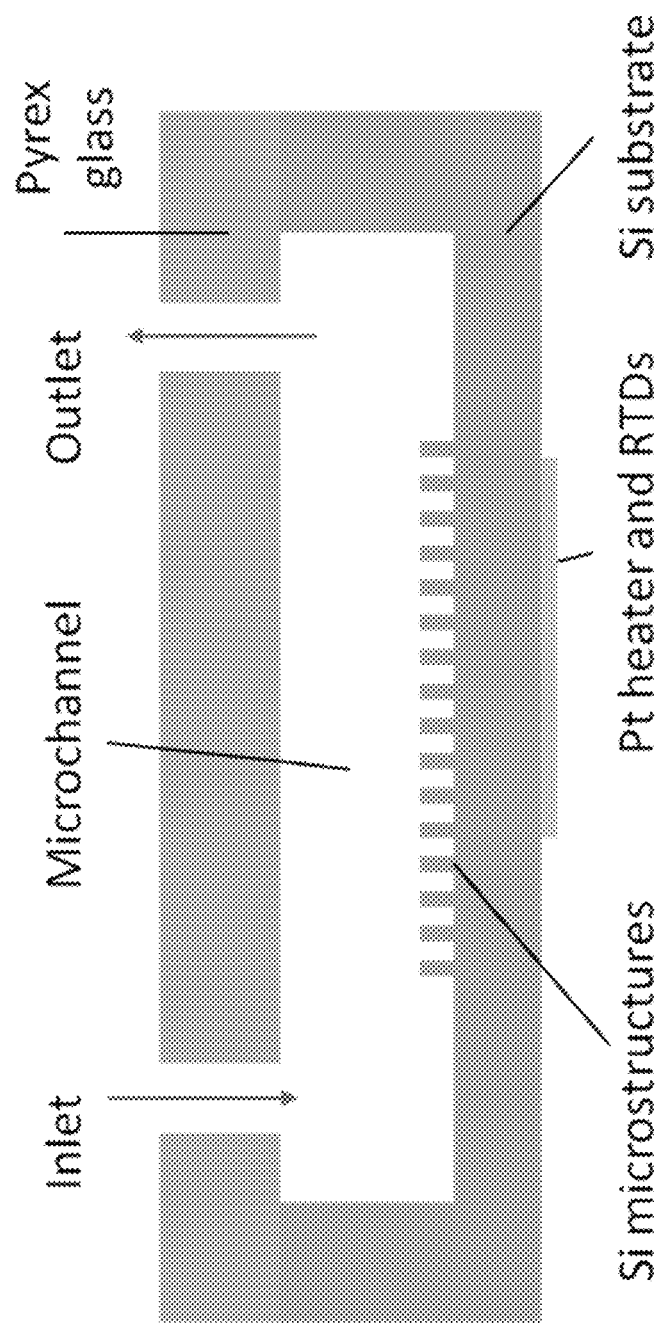
FIG. 1 is a schematic of the microchannel design.

The increasing power densities in modern integrated circuits (ICs) pose significant thermal management challenges for the electronics industry. For example, as central processing units (CPUs) have approached heat fluxes of 100 W/cm², typical commercial fin-fan based thermal management strategies are no longer able to dissipate the required fluxes, and as a result have led to the design of multi-core processors. See E. Pop, "Energy dissipation and transport in nanoscale devices," *Nano Res.*, vol. 3, no. 3, pp. 147-169, March 2010, which is incorporated by reference in its entirety. Yet, the International Technology Roadmap for Semiconductors (ITRS) predicts next generation CPUs to exceed 100 W/cm² by 2015. See J. R. Thome, "The New Frontier in Heat Transfer: Microscale and Nanoscale Technologies," *Heat Transf. Eng.*, vol. 27, pp. 1-3, 2006, which is incorporated by reference in its entirety. In addition, the thermal management demands for other electronic systems such as concentrated photovoltaics, power electronics, and laser diodes, are exceeding heat fluxes of 1000 W/cm². See S. Krishnan, S. V. Garimella, G. M. Chrysler, and R. V. Mahajan, "Towards a Thermal Moore's Law," *IEEE Trans. Adv. Packag.*, vol. 30, no. 3, pp. 462-474, 2007, which is incorporated by reference in its entirety. The need for thermal management schemes capable of dissipating such high heat fluxes in uniform temperature environments and with small increases in temperature has been well-recognized.

The latent heat of a fluid is in general 2-3 orders of magnitude higher than its specific heat capacity. See A. Bejan, *Advanced engineering thermodinamics*. New York: Wiley, 2006, which is incorporated by reference in its entirety. Evaporation has been most commonly used in heat pipes, where heat fluxes in the range of 50-100 W/cm² have been achieved. See H. A. Kariya, T. B. Peters, M. Cleary, D. F. Hanks, W. L. Staats, J. G. Brisson, and E. N. Wang, "Development and Characterization of an Air-Cooled Loop Heat Pipe With a Wick in the Condenser," *J. Therm. Sci. Eng. Appl.*, vol. 6, no. 1, pp. 011010-011010, October 2013, which is incorporated by reference in its entirety. Meanwhile, pool boiling has also demonstrated critical heat flux (CHF) values of approximately 100 W/cm² with water as the working fluid on smooth surfaces. See N. Zuber, "Hydrodynamic Aspects of Boiling Heat Transfer," California. Univ., Los Angeles; and Ramo-Wooldridge Corp., Los Angeles, 1959, which is incorporated by reference in its entirety. With the recent introduction of micro/nanostructures on the boiling surface, CHF values have reached 250 W/cm². See K.-H. Chu, Y. Soo Joung, R. Enright, C. R. Buie, and E. N. Wang, "Hierarchically structured surfaces for boiling critical heat flux enhancement," *Appl. Phys. Lett.*, vol. 102, no. 15, pp. 151602-151602-4, April 2013, which is incorporated by reference in its entirety. Besides the fact that CHF values cannot reach the desired high fluxes, pool boiling is typically impractical for implementation with electronic systems.

Two-phase microchannel heat sinks promise to address the challenge in high-flux heat dissipation and uniform temperature control for various electronic devices. See, K. A. Triplett, S. M. Ghiaasiaan, S. I. Abdel-Khalik, and D. L. Sadowski, "Gas-liquid two-phase flow in microchannels Part I: two-phase flow patterns," *Int. J. Multiph. Flow*, vol. 25, no. 3, pp. 377-394, April 1999, and K. A. Triplett, S. M. Ghiaasiaan, S. I. Abdel-Khalik, A. LeMouel, and B. N. McCord, "Gas-liquid two-phase flow in microchannels: Part II: void fraction and pressure drop," *Int. J. Multiph. Flow*, vol. 25, no. 3, pp. 395-410, April 1999, each of which is incorporated by reference in its entirety. Additionally in microchannel heat sinks, the large surface to volume ratio offers lower thermal resistance than its macroscale counterparts. However, the main challenges with these devices are associated with flow instabilities and the need to increase CHF. Minimizing flow instabilities during boiling while enhancing the critical heat flux (CHF) to maximize heat dissipation have been difficult to achieve. See, S. G. Kandlikar, "Fundamental issues related to flow boiling in minichannels and microchannels," *Exp. Therm. Fluid Sci.*, vol. 26, no. 2-4, pp. 389-407, June 2002, P. K. Das, S. Chakraborty, and S. Bhaduri, "Critical Heat Flux During Flow Boiling in Mini And Microchannel-A State of The Art Review," *Front. Heat Mass Transf.*, vol. 3, no. 1, January 2012, and A. E. Bergles, J. H. L. V, G. E. Kendall, and P. Griffith, "Boiling and Evaporation in Small Diameter Channels," *Heat Transf. Eng.*, vol. 24, no. 1, pp. 18-40, January 2003, each of which is incorporated by reference in its entirety. The former issue arises from the dominance of surface tension at the small length scales (i.e., much lower than the capillary length); the rapid expansion of the vapor bubble occupying the cross-section of microchannel before bubble departure, leads to large pressure fluctuations in the flow channels (i.e., instability) and liquid dry-out during boiling. See, G. Hetsroni, A. Mosyak, E. Pogrebnyak, and Z. Segal, "Explosive boiling of water in parallel micro-channels," *Int. J. Multiph. Flow*, vol. 31, no. 4, pp. 371-392, April 2005, T. Zhang, Y. Peles, J. T. Wen, T. Tong, J.-Y. Chang, R. Prasher, and M. K. Jensen, "Analysis and active control of pressure-drop flow instabilities in boiling microchannel systems," *Int. J. Heat Mass Transf.*, vol. 53, no. 11-12, pp. 2347-2360, May 2010, T. Zhang, T. Tong, J.-Y. Chang, Y. Peles, R. Prasher, M. K. Jensen, J. T. Wen, and P. Phelan, "Ledinegg instability in microchannels," *Int. J. Heat Mass Transf.*, vol. 52, no. 25-26, pp. 5661-5674, December 2009, and G. Yadigaroglu and A. E. Bergles, "Fundamental and Higher-Mode Density-Wave Oscillations in Two-Phase Flow," *J. Heat Transf.*, vol. 94, no. 2, pp. 189-195, May 1972, each of which is incorporated by reference in its entirety. This dry-out severely limits the heat removal efficiency of these microchannel heat sink systems and leads to spikes in surface temperature due to presence of this temporary vapor film. See A. E. Bergles and S. G. Kandlikar, "On the Nature of Critical Heat Flux in Microchannels," *J. Heat Transf.*, vol. 127, no. 1, pp. 101-107, February 2005, which is incorporated by reference in its entirety.

Therefore, recent studies have focused on using structures, such as inlet restrictors, artificial nucleation sites, vapour venting membranes, reentrant cavities, microbreathers, and nanowire-coated surfaces integrated into the microchannel, to mitigate the flow instability and to enhance heat transfer. However, there are challenges with several of these approaches. Inlet restrictors can significantly reduce backflow but with a pressure drop penalty for the stabilization. Fabricated nucleation sites have demonstrated enhanced nucleate boiling heat transfer, however, the introduction of the cavities alone can increase the instabilities. Vapor venting membranes can reduce dry-out and pressure drop oscillations by locally removing the expanding vapor, however the operational range is limited due to the risk of membrane flooding at high pressures. See, A. Koşar, C.-J. Kuo, and Y. Peles, "Suppression of Boiling Flow Oscillations in Parallel Microchannels by Inlet Restrictors," *J. Heat Transf.*, vol. 128, no. 3, pp. 251-260, September 2005, G. Wang, P. Cheng, and A. E. Bergles, "Effects of inlet/outlet configurations on flow boiling instability in parallel microchannels," *Int. J. Heat Mass Transf.*, vol. 51, no. 9-10, pp. 2267-2281, May 2008, S. G. Kandlikar, W. K. Kuan, D. A. Willistein, and J. Borrelli, "Stabilization of Flow Boiling in Microchannels Using Pressure Drop Elements and Fabricated Nucleation Sites," *J. Heat Transf.*, vol. 128, no. 4, pp. 389-396, December 2005, A. Fazeli, M. Mortazavi, and S. Moghaddam, "Hierarchical biphilic micro/nanostructures for a new generation phase-change heat sink," *Appl. Therm. Eng.*, vol. 78, pp. 380-386, March 2015, A. Koşar, C.-J. Kuo, and Y. Peles, "Boiling heat transfer in rectangular microchannels with reentrant cavities," *Int. J. Heat Mass Transf.*, vol. 48, no. 23-24, pp. 4867-4886, November 2005, M. P. David, J. E. Steinbrenner, J. Miler, and K. E. Goodson, "Adiabatic and diabatic two-phase venting flow in a microchannel," *Int. J. Multiph. Flow*, vol. 37, no. 9, pp. 1135-1146, November 2011, B. R. Alexander and E. N. Wang, "Design of a Microbreather for Two-Phase Microchannel Heat Sinks," *Nanoscale Microscale Thermophys. Eng.*, vol. 13, no. 3, pp. 151-164, 2009, D. Li, G. S. Wu, W. Wang, Y.

D. Wang, D. Liu, D. C. Zhang, Y. F. Chen, G. P. Peterson, and R. Yang, "Enhancing Flow Boiling Heat Transfer in Microchannels for Thermal Management with Monolithically-Integrated Silicon Nanowires," *Nano Lett.*, vol. 12, no. 7, pp. 3385-3390, July 2012, F. Yang, X. Dai, Y. Peles, P. Cheng, J. Khan, and C. Li, "Flow boiling phenomena in a single annular flow regime in microchannels (I): Characterization of flow boiling heat transfer," *Int. J. Heat Mass Transf.*, vol. 68, pp. 703-715, January 2014, and F. Yang, X. Dai, Y. Peles, P. Cheng, J. Khan, and C. Li, "Flow boiling phenomena in a single annular flow regime in microchannels (II): Reduced pressure drop and enhanced critical heat flux," *Int. J. Heat Mass Transf.*, vol. 68, pp. 716-724, January 2014, each of which is incorporated by reference in its entirety.

The previous studies attribute the reduction in instabilities due to pressure regulation of inlet restrictors, an increase in the nucleation density from the reentrant cavities, and local venting of the vapor by a porous membrane (microbreather). Micro and nanostructure-coated surfaces have the advantage of avoiding extra pressure drop across the inlet restrictors and delaying dry-out by capillary wicking Li et al. reported enhancement in flow boiling heat transfer performance with silicon nanowire-coated channel surfaces. Yang et al. reported increased CHF and reduced pressure drop with silicon nanowire-coated channel surfaces. The enhancement in CHF is proposed to be due to the wicking ability of the hydrophilic nanowires which rewet the surface and prevent dry-out. While it is clear that micro and nanostructure coated surfaces in microchannel heat sinks enhance the performance of these devices, the precise role of capillary-length-scale surface structures on the flow instability is not well-understood. While the hydrophilic structures generate capillary pressure, they also create viscous resistance as the liquid rewets the surface. See, R. Xiao, R. Enright, and E. N. Wang, "Prediction and Optimization of Liquid Propagation in Micropillar Arrays," *Langmuir*, vol. 26, no. 19, pp. 15070-15075, October 2010, which is incorporated by reference in its entirety. The effect of the geometry of the surface structure on the viscous resistance which could hinder the rewetting process has not been well studied.

Micro- and nanostructure-coated surfaces are attractive owing to the ability to modify surface wettability, generate capillarity and create nucleation sites. In fact, in pool boiling, superhydrophilic micro and nanostructures have demonstrated significantly increased CHF. See, V. K. Dhir, "Boiling Heat Transfer," *Annu. Rev. Fluid Mech.*, vol. 30, no. 1, pp. 365-401, 1998, R. Chen, M.-C. Lu, V. Srinivasan, Z. Wang, H. H. Cho, and A. Majumdar, "Nanowires for Enhanced Boiling Heat Transfer," *Nano Lett.*, vol. 9, no. 2, pp. 548-553, February 2009, C. Li, Z. Wang, P.-I. Wang, Y. Peles, N. Koratkar, and G. P. Peterson, "Nanostructured Copper Interfaces for Enhanced Boiling," *Small*, vol. 4, no. 8, pp. 1084-1088, August 2008, H. S. Ahn, H. J. Jo, S. H. Kang, and M. H. Kim, "Effect of liquid spreading due to nano/microstructures on the critical heat flux during pool boiling," *Appl. Phys. Lett.*, vol. 98, no. 7, p. 071908, February 2011, M. M. Rahman, E. Ölçeroğlu, and M. McCarthy, "Role of Wickability on the Critical Heat Flux of Structured Superhydrophilic Surfaces," *Langmuir*, vol. 30, no. 37, pp. 11225-11234, September 2014, K.-H. Chu, R. Enright, and E. N. Wang, "Structured surfaces for enhanced pool boiling heat transfer," *Appl. Phys. Lett.*, vol. 100, no. 24, p. 241603, June 2012, and K.-H. Chu, Y. Soo Joung, R. Enright, C. R. Buie, and E. N. Wang, "Hierarchically structured surfaces for boiling critical heat flux enhancement," *Appl. Phys. Lett.*, vol. 102, no. 15, pp. 151602-151602-4, April 2013, each of which is incorporated by reference in its entirety. Also biphilic patterned surfaces have shown large enhancements in heat transfer coefficients. See, A. R. Betz, J. Jenkins, C.-J. "CJ" Kim, and D. Attinger, "Boiling heat transfer on superhydrophilic, superhydrophobic, and super-biphilic surfaces," *Int. J. Heat Mass Transf.*, vol. 57, no. 2, pp. 733-741, February 2013, and A. R. Betz, J. Xu, H. Qiu, and D. Attinger, "Do surfaces with mixed hydrophilic and hydrophobic areas enhance pool boiling?," *Appl. Phys. Lett.*, vol. 97, no. 14, p. 141909, October 2010, each of which is incorporated by reference in its entirety. In flow boiling, silicon nanowire-coated channel surfaces have been reported to reduce temperature fluctuations, increase the heat transfer coefficient and CHF, and decrease the pressure drop across the microchannels with water as the working fluid. See, D. Li, G. S. Wu, W. Wang, Y. D. Wang, D. Liu, D. C. Zhang, Y. F. Chen, G. P. Peterson, and R. Yang, "Enhancing Flow Boiling Heat Transfer in Microchannels for Thermal Management with Monolithically-Integrated Silicon Nanowires," *Nano Lett.*, vol. 12, no. 7, pp. 3385-3390, July 2012, F. Yang, X. Dai, Y. Peles, P. Cheng, J. Khan, and C. Li, "Flow boiling phenomena in a single annular flow regime in microchannels (I): Characterization of flow boiling heat transfer," *Int. J. Heat Mass Transf.*, vol. 68, pp. 703-715, January 2014, and F. Yang, X. Dai, Y. Peles, P. Cheng, J. Khan, and C. Li, "Flow boiling phenomena in a single annular flow regime in microchannels (II): Reduced pressure drop and enhanced critical heat flux," *Int. J. Heat Mass Transf.*, vol. 68, pp. 716-724, January 2014, each of which is incorporated by reference in its entirety. The enhancement mechanism was mainly attributed to both increased wettability in delaying CHF and nucleation sites formed by the nanowire bundles to improve the heat transfer coefficient in the nucleate boiling regime. At high heat fluxes, however, the annular flow regime typically dominates, where film evaporation is the important heat transfer mode. See, S. G. Kandlikar, "Fundamental issues related to flow boiling in minichannels and microchannels," *Exp. Therm. Fluid Sci.*, vol. 26, no. 2-4, pp. 389-407, June 2002, which is incorporated by reference in its entirety. Thus the role of the surface structures on the stability of the annular liquid film and on the film evaporation performance needs to be investigated. In addition, while introducing structures on the channel wall offers capillary driven liquid flow, the associated viscous resistance from the structures, especially in the presence of shear from the vapor, can be significant. These effects are sensitive to the geometry of the structures. See, S. Shin, G. Choi, B. S. Kim, and H. H. Cho, "Flow boiling heat transfer on nanowire-coated surfaces with highly wetting liquid," *Energy*, vol. 76, pp. 428-435, November 2014, C. Kleinstreuer and J. Koo, "Computational Analysis of Wall Roughness Effects for Liquid Flow in Micro-Conduits," *J. Fluids Eng.*, vol. 126, no. 1, pp. 1-9, February 2004, and M. Bahrami, M. M. Yovanovich, and J. R. Culham, "Pressure Drop of Fully Developed, Laminar Flow in Rough Microtubes," *J. Fluids Eng.*, vol. 128, no. 3, pp. 632-637, October 2005, each of which is incorporated by reference in its entirety. Therefore the precise role of the surface structures on flow boiling needs to be studied in more detail.

Disclosed herein is the role of well-defined superhydrophilic microstructured surfaces in microchannels for flow boiling heat transfer (length scale around 10 µm, an order of magnitude different from the silicon nanowires) and characterized the heat transfer and pressure drop in microchannels with well-defined micropillar arrays on the bottom channel wall, where heat is applied. The hydrophilic micropillars were only integrated on the heated bottom surface to promote wicking and film evaporation while suppressing dry-out and facilitating nucleation only from the sidewalls. The sidewalls, with tailored roughness of 1-2 μm, promoted nucleation near the bottom corners. See, Y. Y. Hsu, "On the Size Range of Active Nucleation Cavities on a Heating Surface," *J. Heat Transf.*, vol. 84, no. 3, pp. 207-213, August 1962, which is incorporated by reference in its entirety. Spatially decoupling nucleation to the sidewalls and film evaporation to the bottom surface promises to achieve high heat fluxes while maintaining stable heat transfer performance. The experimental results show significantly reduced temperature and pressure drop fluctuation especially at high heat fluxes. A critical heat flux (CHF) of 969 W/cm$^2$ was achieved with a structured surface, a 57% enhancement compared to a smooth surface. The structured surface microchannel and benchmark smooth surface microchannel devices were characterized in a custom closed loop setup. In particular, flow instabilities was investigated through temporally resolved temperature and pressure drop measurements, and simultaneous visualization of the flow in the device. The heat transfer performance (the heat transfer coefficient, the CHF and the pressure drop) was also characterized and the experimental trends for the CHF enhancement with an adiabatic liquid wicking model was explained. Also shown is that the experimental trends for the CHF enhancement can be explained with a liquid wicking model. The results suggest that capillary flow can be maximized to enhance heat transfer via optimizing the microstructure geometry for the development of high performance two-phase microchannel heat sinks. The insights gained from this work is a first step towards guiding the design of stable, high performance surface structure enhanced two-phase microchannel heat sinks A custom closed loop test setup demonstrated heat flux of ~1470 W/cm$^2$ with mass flux of ~1849 kg/m$^2$·s and 3-8° C. temperature fluctuations. The results were compared to the heat transfer and pressure drop performance of a flat sample. The microstructured sample with the smaller diameter and spacing microstructures showed a higher heat transfer coefficient. The enhanced performance is attributed to the capillary wicking capability of the microstructures. With these microchannel designs, two-phase heat transfer and fluid flow behavior can be decoupled. Bubbles are generated via the less hydrophilic side walls while the superhydrophilic microstructures at the bottom of the channel prevent dry out. This is the first step towards understanding the role of micro and nanostructured surfaces for the development of high performance two-phase microchannel heat sinks.

A hydrophilic surface is one that has a water contact angle between 5° and 90°; a superhydrophilic surface has a water contact angle <5°. A hydrophobic surface has a water contact angle from 90° to 150°; a superhydrophobic surface has a water contact angle of >150°. A oleophilic surface is one that has an oil contact angle between 5° and 90°; a superoleophilic surface has an oil contact angle <5°. An oleophobic surface has an oil contact angle from 90° to 150°; a superoleophobic surface has an oil contact angle of >150°.

Textured surfaces can promote superhydrophilic behavior. Early theoretical work by Wenzel and Cassie-Baxter and more recent studies by Quéré and coworkers suggest that it is possible to significantly enhance the wetting of a surface with water by introducing roughness at the right length scale. See, for example, Wenzel, R. N. *J. Phys. Colloid Chem.* 1949, 53, 1466; Wenzel, R. N. Ind. Eng. Chem. 1936, 28, 988; Cassie, A. B. D.; Baxter, S. *Trans. Faraday Soc.* 1944, 40, 546; Bico, J.; et al., D. *Europhysics Letters* 2001, 55, (2), 214-220; and Bico, J.; et al. *Europhysics Letters* 1999, 47, (6), 743-744, each of which is incorporated by reference in its entirety. Building on this work, it has recently been demonstrated that both lithographically textured surfaces and microporous surfaces can be rendered superhydrophilic. See, e.g., McHale, G.; Shirtcliffe, N. J.; Aqil, S.; Perry, C. C.; Newton, M. I. *Physical Review Letters* 2004, 93, (3), which is incorporated by reference in its entirety. The intriguing possibility of switching between a superhydrophobic and superhydrophilic state has also been demonstrated with some of these surface structures. See, for example, Sun, T. L.; et al. *Angewandte Chemie-International Edition* 2004, 43, (3), 357-360; and Gao, Y. F.; et al. *Langmuir* 2004, 20, (8), 3188-3194, each of which is incorporated by reference in its entirety.

A two-phase microchannel heat sink can be a fluid channel including a bottom wall including a superhydrophilic surface, and a side wall including a surface that is hydrophobic relative to the superhydrophilic surface of the bottom wall. When heat flux is applied to the fluid channel, a liquid film on the bottom wall is maintained and nucleation of boiling occurs only on the side wall. By confining the boiling region to the side wall, instability due to the bubbles can be limited. The superhydrophilicity of the bottom wall can be due to a plurality of microstructures. The microstructures can be micropillars. The cross-section of the microstructure can be in any shape: squares, rectangular, and star, pointed tips, elliptical, polygon. The microstructures can be carbon nanotubes.

A method of transferring heat can include applying a heat source to a hydrophilic heat transfer region of a device, and transferring a heated fluid to a boiling region, wherein the boiling region is hydrophobic relative to the heat transfer region. The hydrophilic heat transfer region can include a plurality of microstructures to enhance its hydrophilicity. The microstructures can be micropillars. The microstructures can be carbon nanotubes.

The geometry of microstructures, such as the spacing between the microstructures and the height of the microstructures, is an important factor for its superhydrophilicity. The less the spacing between the microstructures and the higher the height of the microstructures, the higher is the capillary effect. The height of a micropillar can be no more than 10 μm, no more than 25 μm, no more than 50 μm, or no more than 100 μm. The diameter of the micropillar can be no more than 5 μm, no more than 10 μm, no more than 20 μm, or no more than 50 μm. The pitch (i.e. center to center spacing) between the two adjacent micropillars can be no more than 10 μm, no more than 25 μm, no more than 50 μm, or no more than 100 μm. The ratio of the diameter of a micropillar to the pitch can be no more than 0.2, no more than 0.3, no more than 0.4, no more than 0.5, or no more than 0.6. The microchannel can be made of silicon, copper, aluminum, steel or diamond. Copper can be micromachined and electroplated to get the structures. Diamond can be etched. The microchannel can be further coated with a superhydrophilic material, such as silicon dioxide, copper oxide, aluminum oxide, or zinc oxide, to enhance hydrophilicity. The side wall can be coated with a hydrophobic material, such as Teflon, to enhance the difference in hydrophilicity between the bottom wall and the side wall.

Two-phase microchannel heat sinks are attractive because they utilize the latent heat of vaporization to dissipate high heat fluxes in a compact form factor. For example, two-phase heat transfer in 500 μm×500 μm×10 mm microchannels with micropillars arrays (heights of ~25 μm, diameters of 5-10 μm and pitches of 10-40 μm) on the bottom channel wall can be used. When heat is applied to the bottom channel wall, microscale surface structures with micropillar arrays can affect flow boiling and heat transfer performance. When the flow patterns were simultaneously visualized using degassed, de-ionized water as the working fluid, nucleation occurred primarily on the side walls. Small fluctuations in the measured heater surface temperature (±3-8° C.) indicated increased flow stability. The maximum heat flux observed was 1470 W/cm² with a mass flux of 1849 kg/m²·s and a heater temperature rise of 45° C. When compared to the structured surfaces, higher fluctuations in both pressure and heater temperature were observed for a flat surface microchannel at lower heat fluxes. While the overall maximum heat flux values were comparable, the heat transfer coefficient for the structured surface microchannel was 37% higher. These observations suggest that with these microchannel designs, two-phase heat transfer and fluid flow behavior can be decoupled. Bubbles are generated via the less hydrophilic sidewalls while the superhydrophilic microstructures at the bottom of the channel enhance the capillary wicking capability to prevent dry out. This approach can potentially increase the critical heat flux and is a first step towards understanding the role of microstructured surfaces in microchannels for high performance two-phase microchannel heat sinks.

EXAMPLES

Fabricated Test Devices and Experimental Setup

In high heat flux applications, microchannel heat sinks usually operate in the annular flow regime due to the high vapor quality associated with heat dissipation in the confined space. See, V. P. Carey, *Liquid Vapor Phase Change Phenomena: An Introduction to the Thermophysics of Vaporization and Condensation Processes in Heat Transfer Equipment, Second Edition*. Taylor & Francis, 2007, which is incorporated by reference in its entirety. Since evaporation can be dominant in the annular flow regime, the structured surfaces were designed to enhance and sustain stable liquid film evaporation (FIGS. 9A (side view) and 9B (cross-section view)). The structures were integrated only on the bottom heated surface where the wall temperature and the heat flux is the highest in order to suppress liquid dry-out by generating capillary flow in the presence of menisci formation which create the capillary pressure gradient, dP/dx, that helps drive the liquid flow (FIG. 9C). The equation that describes the liquid pressure below the meniscus is the Young-Laplace equation where a is the surface tension of the liquid, r is the radius of curvature of the local meniscus, and $P_{liquid}$ and $P_{vapor}$ are the local pressure of the liquid and vapor respectively. This capillary flow can be created both along the channel direction and from the sidewalls to the center (the dotted line regions in FIGS. 9A and 9B). The sidewalls have tailored roughness of 1-2 μm to promote nucleation. See, Y. Y. Hsu, "On the Size Range of Active Nucleation Cavities on a Heating Surface," *J. Heat Transf.*, vol. 84, no. 3, pp. 207-213, August 1962, which is incorporated by reference in its entirety. By nucleating on the side walls, it is less likely to have dry-out occur on the bottom surface, which typically occurs in the case of smooth microchannel walls owing to explosive bubble growth from it.

To investigate the effect of surface structure on flow instability, silicon (Si) micropillars with heights of 25 μm, diameters of 5-10 μm and pitches of 10-40 μm were integrated into microchannels of 10 mm×500 μm×500 μm (length, width and height), as shown in FIG. 1. FIG. 1 shows a schematic of the microchannel design. The 8.5 mm (length)×250 μm (width) platinum (Pt) heater and four resistance temperature detectors (RTDs) were fabricated along the channel on the back side.

Figure 3A:
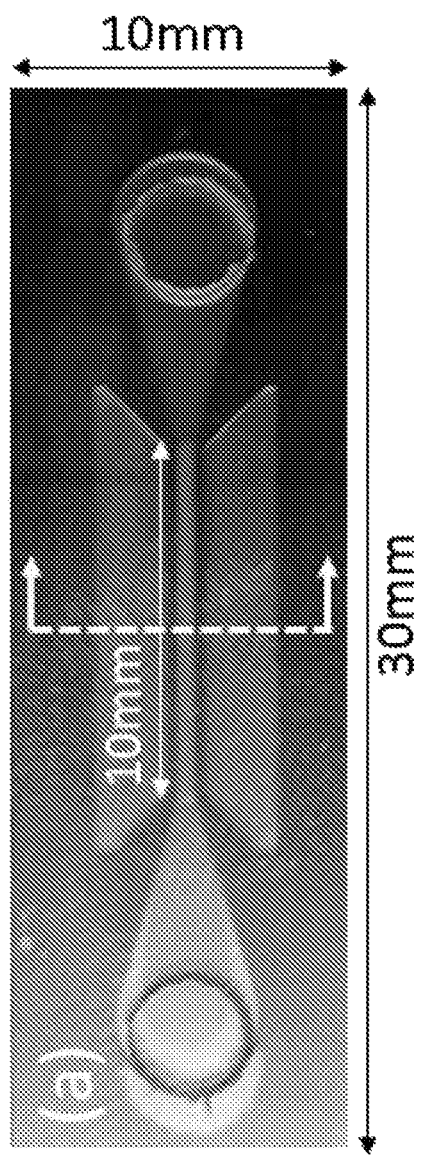

The fabrication process is summarized in FIG. 2. Micropillars 201 with heights of ~25 μm, diameters of 5-10 μm and pitches of 10-40 μm were etched out in Si wafer 202 using deep reactive ion etching (DRIE) of the channel bottom surface (FIG. 2A). A second 500 μm thick Si wafer was etched through using DRIE to define the channel sidewalls 203 (FIG. 2B). The two Si wafers were bonded together using Si—Si fusion bonding (FIG. 2C). Inlet 204 and outlet 205 ports were created on a Pyrex wafer 206 by laser drilling (FIG. 2D). A 500 nm silicon dioxide ($SiO_2$) layer was grown on the Si surface as a hydrophilic coating (FIG. 2E). The Pyrex wafer 206 was subsequently bonded onto the Si wafer using anodic bonding to cover the microchannel and facilitate flow visualizations (FIG. 3A). Finally, a layer of 200 nm thick platinum (Pt) 207 was deposited on the back side of the channel with E-beam evaporation and patterned by lift-off technique to serve as the heater (8.5 mm long×250 μm wide) and resistance temperature detectors (RTDs) (FIG. 2F and FIG. 3B). A similar fabrication procedure is followed for the flat surface microchannel, however a polished Si wafer is used instead of the DRIE micropillar wafer from step 1 (i.e., FIG. 2A). To maximize the power dissipation capability of the heater, the target heater resistance was determined by the maximum allowable heater voltage (180 V) and current (0.5 A) to prevent burnout. To achieve this target resistance of 360Ω, the thin film heater thickness and dimensions were designed. In addition to the microstructured microchannels, microchannels with smooth surfaces were also fabricated following a similar procedure, however a polished Si wafer (roughness <50 nm) was used instead of the micropillar wafer in the initial step (FIG. 10B).

Figures 11A, 11B:
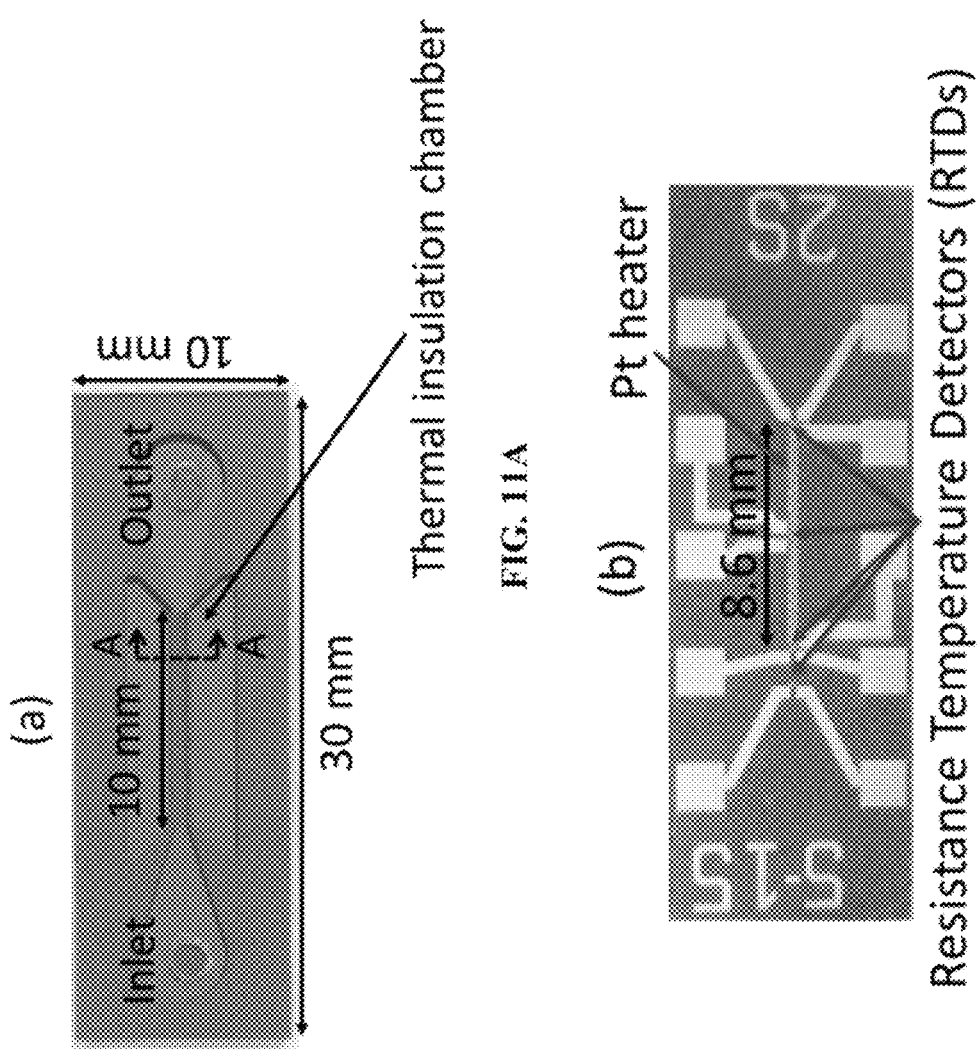
FIGS. 11A-11D are images of a representative fabricated microchannel with micropillar arrays.
Figure 11C:
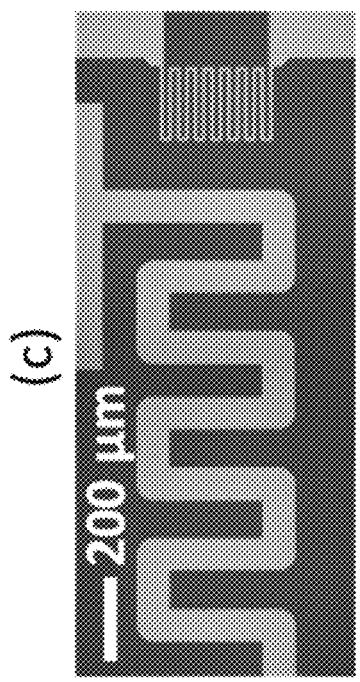
Figure 11D:
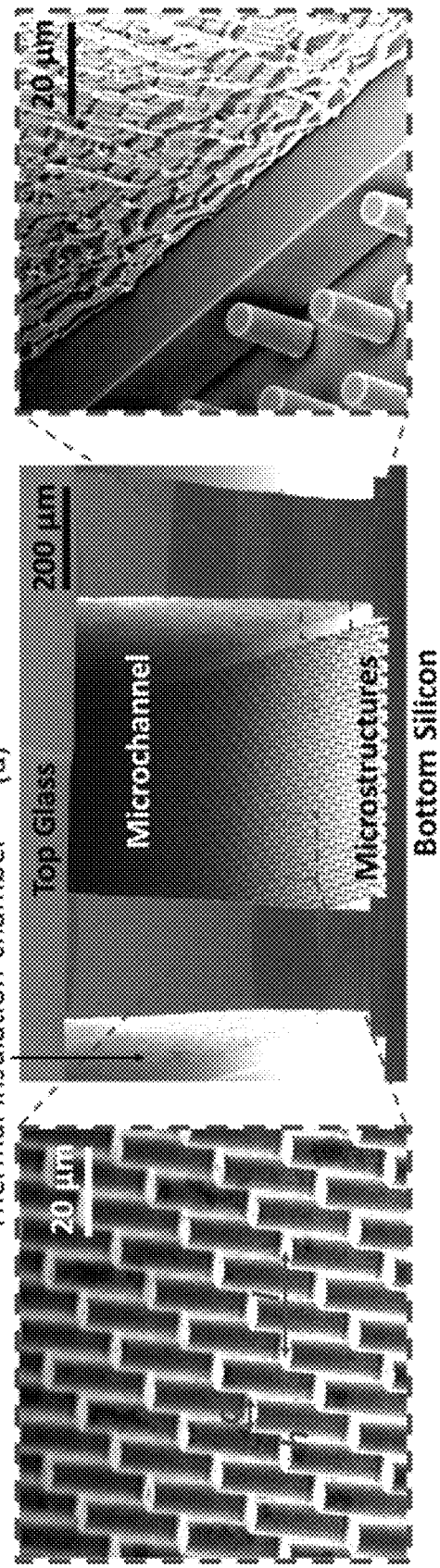

FIGS. 11A and 11B show the front and backside of a fabricated microchannel device. The two open chambers next to the microchannel (FIGS. 11A and 11D) were incorporated to minimize heat loss via conduction and to better isolate the effect of flow boiling in the microchannel. FIG. 11C shows a magnified view of the Pt heater and an RTD4 on the backside of the microchannel. FIG. 11D shows a scanning electron micrograph (SEM) of the cross-section of the microchannel (A-A plane in FIG. 11A) with representative micropillars. The magnified views of micropillars on the channel bottom surface and a side wall near the bottom corner are shown in the left and right inset of FIG. 11D. The side walls have small roughness (~1-2 μm) from the DRIE process (FIG. 11C).

FIG. 3C shows the scanning electron micrographs (SEMs) of the cross-section of the microchannel with representative microstructures and the magnified view of microstructures on the channel bottom is shown in the inset of FIG. 3C. Two chambers next to the center microchannel were made for the purpose of thermal insulation. The curved image on the far side of the microchannel was due to image distortion in the SEM.

Detailed surface geometries of the fabricated devices are listed in Table 1. Microstructures with two different geometries were designed to test the effects of solid fraction φ, roughness factor r (i.e., r=total surface area/projected surface area), and permeability $γ^{-2}$ on the heat transfer and flow characteristics during boiling. These micropillar geometries were chosen for the following reasons: (1) The micropillars are easy to fabricate in silicon (Si) using standard etching processes and the geometries can be well-controlled in this range. (2) At these length scales, the capillary pressures that can be generated are a few kPas which are comparable to the typical microchannel pressure drop. This suggests that capillary effects are not small and can be used to manipulate flow behavior. (3) The surface structures are mechanically robust and will not change morphology (deform or form clusters) as the liquid evaporates. The specific micropillar geometries fabricated and tested are shown in Tables 1 and 2, which allows investigation of the effect of micropillar diameter d and pitch l on heat transfer and flow characteristics during flow boiling. Specifically, it is aimed to maximize the liquid propagation coefficient in micropillar arrays with a fixed aspect ratio h/d but different pitches l based on a fluid wicking model developed by Xiao et al., where it was demonstrated that there is a maximum liquid propagation flow rate in micropillar arrays with a fixed aspect ratio but different spacing. See, R. Xiao, R. Enright, and E. N. Wang, "Prediction and Optimization of Liquid Propagation in Micropillar Arrays," Langmuir, vol. 26, no. 19, pp. 15070-15075, October 2010, which is incorporated by reference I nits entirety. This was achieved by balancing the capillary driving pressure with the viscous resistance for flow through the porous microstructures. The solid fraction φ is given by:

$$\varphi = (\pi d^2/4)/l^2 \quad (1)$$

The roughness factor r is given by:

$$r = 1 + \pi dh/l^2 \quad (2)$$

The permeability $\gamma^{-2}$ is obtained based on Sangani and Acrivos. See, A. S. Sangani and A. Acrivos, "Slow flow past periodic arrays of cylinders with application to heat transfer," Int. J. Multiph. Flow, vol. 8, no. 3, pp. 193-206, June 1982, which is incorporated by reference in its entirety.

TABLE 1

Geometric parameters of the fabricated microstructures in the microchannels.

| Sample No. | Height, h (μm) | Diameter, d (μm) | Pitch, l (μm) | d/l | φ | r | $\gamma^{-2}$ (m$^2$) |
|---|---|---|---|---|---|---|---|
| D1 | 25 | 5 | 10 | 0.50 | 0.196 | 4.93 | 2.0174e$^{-11}$ |
| D2 | 25 | 10 | 25 | 0.40 | 0.126 | 2.26 | 2.0629e$^{-11}$ |

TABLE 2

Geometric parameters (height, diameter and pitch) of the fabricated micropillars in the microchannel test devices.

| Device No. | Height, h (μm) | Diameter, d (μm) | Pitch, l (μm) |
|---|---|---|---|
| S1 | 25 | 5 | 10 |
| S2 | 25 | 5 | 15 |
| S3 | 25 | 10 | 30 |
| S4 | 25 | 10 | 40 |

Figure 9A:
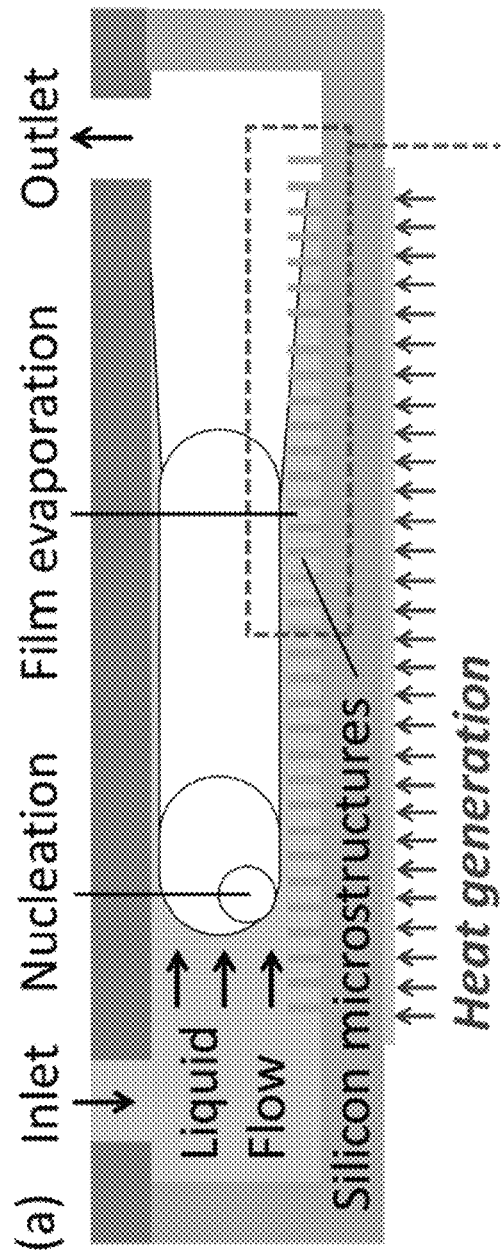
FIGS. 9A-9C are schematics of the microchannel heat sink design with micropillars on the heated surface.
Figure 9B:
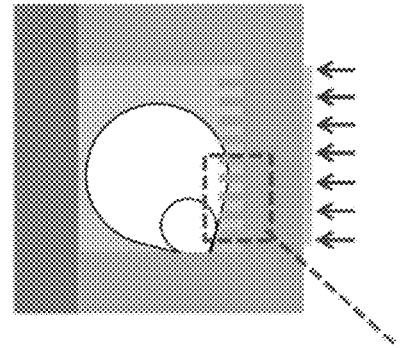
Figure 9C:
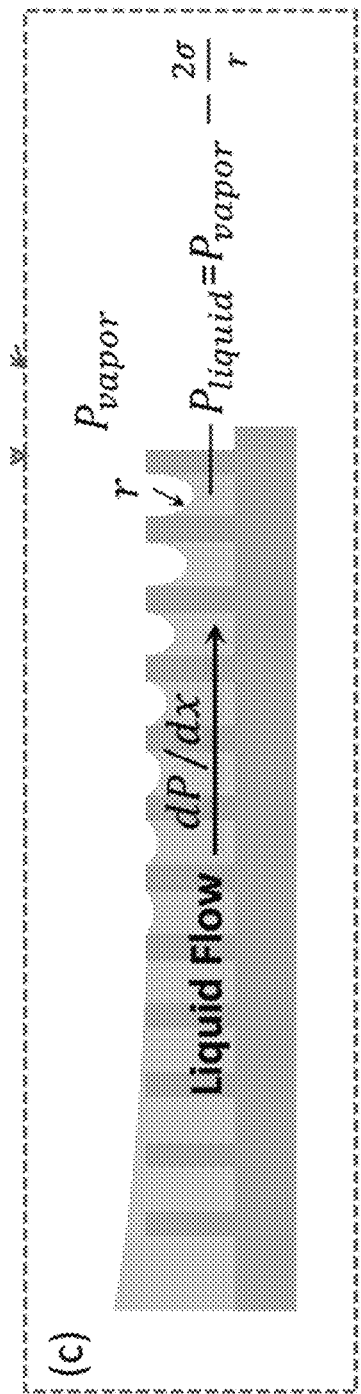
Figure 10A:
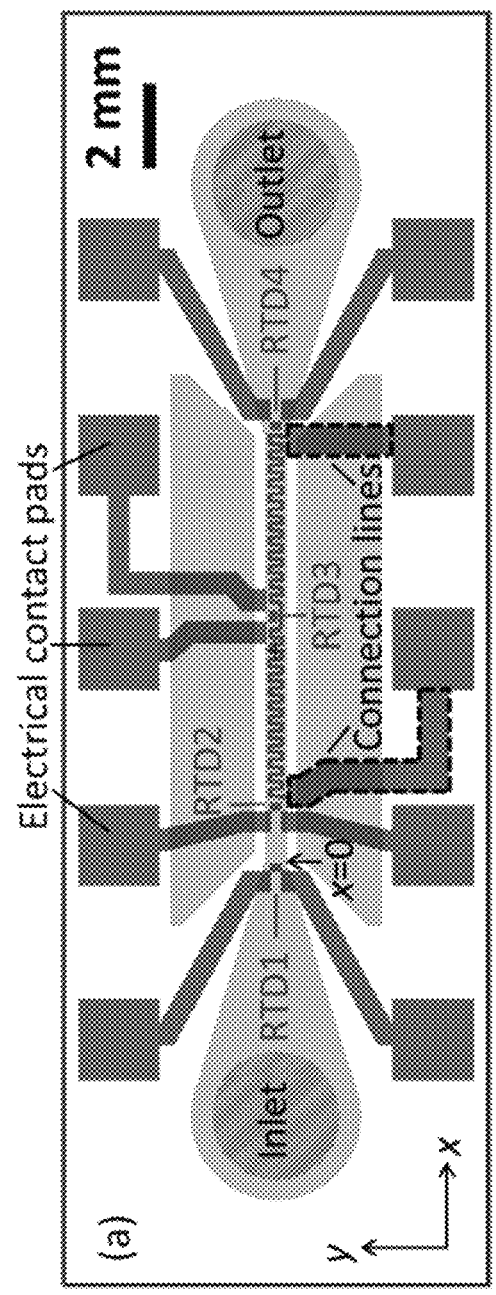
FIGS. 10A-10F are schematics of design and fabrication process of the microchannel device.
Figure 10B:
Figure 10C:
Figure 10D:
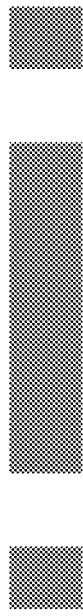
Figure 10E:
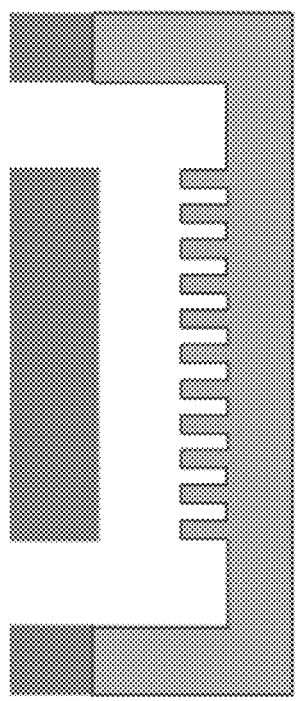
Figure 10F:
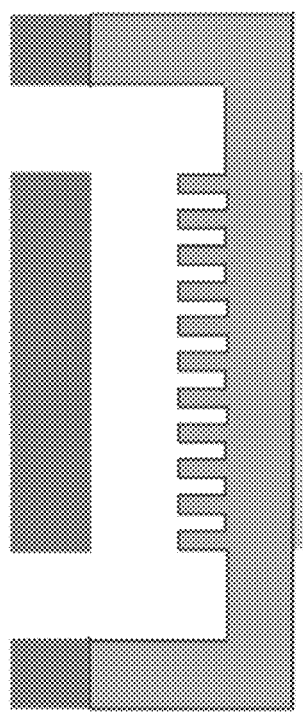

To emulate the heat flux from a high performance electronic device, a thin-film metal heater (8.6 mm long×380 μm wide) was integrated directly underneath the microchannel to serve as a heat source via Joule heating (FIGS. 9A and 10A). FIG. 10A shows schematic (to scale) of the heater and RTDs on the backside of the microchannel device. The dotted sections are the electrical connection lines to the contact pads. In addition to the heating element, four thin-film resistance temperature detectors (RTDs) were incorporated along the length of the heater to measure the microchannel backside surface temperature at different locations. Specifically, the distances x of RTD1 through RTD4 from the inlet of the microchannel were 0 mm, 1.4 mm, 5.7 mm and 10 mm respectively (FIG. 10A).

Figure 4:
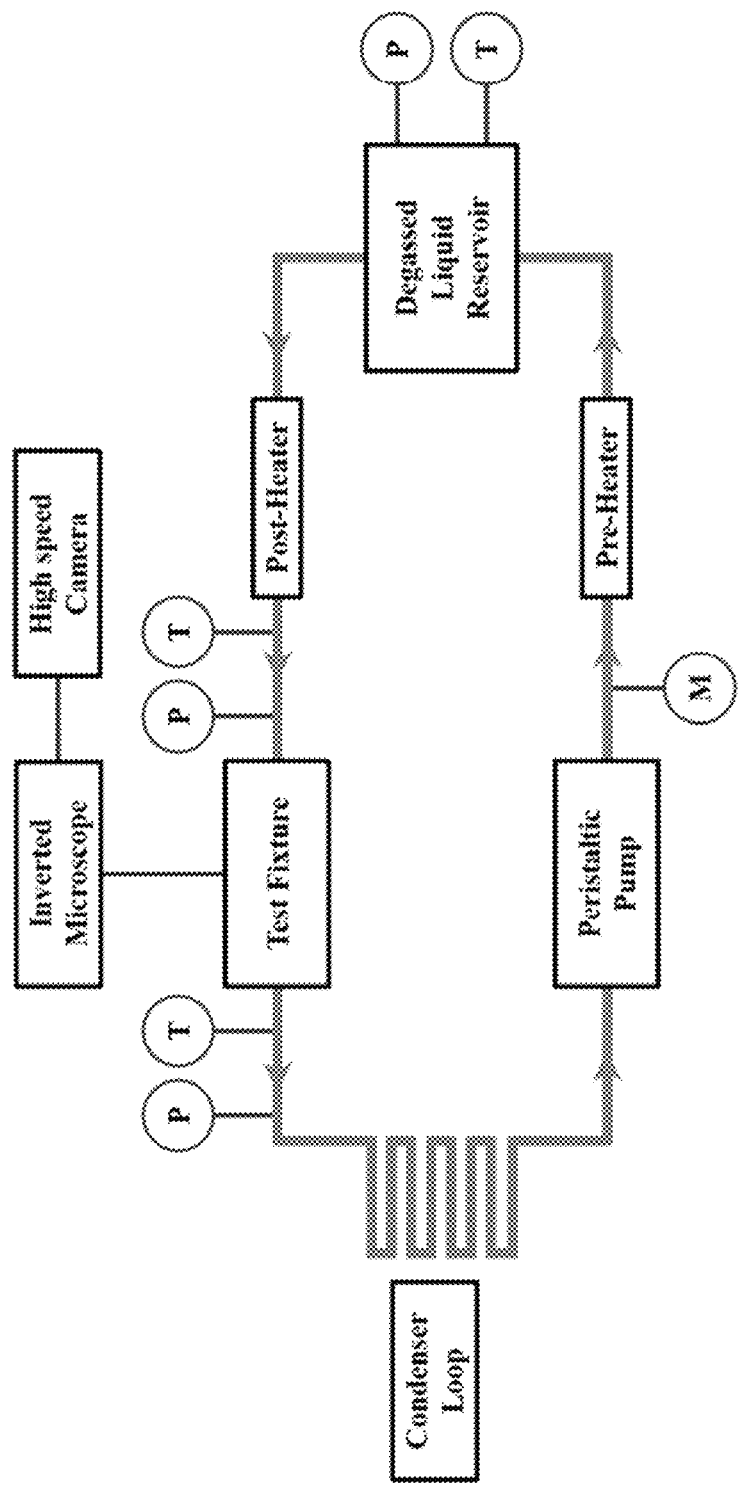
FIG. 4 is a schematic of the custom flow boiling test rig.
Figure 5A:
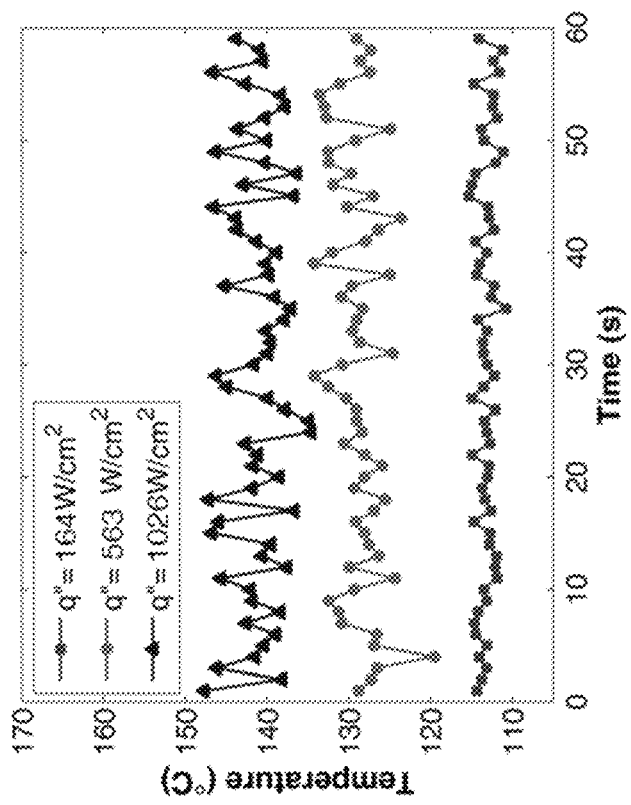
FIGS. 5A-5D are a series of graphs depicting heater surface temperature at the center of the channel and pressure drop across the microchannel of different samples.
Figure 5B:
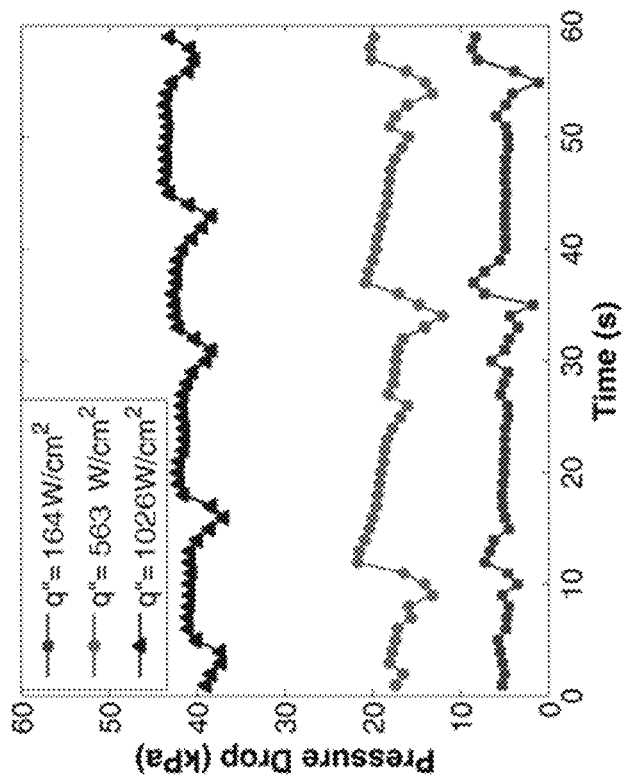
Figure 5C:
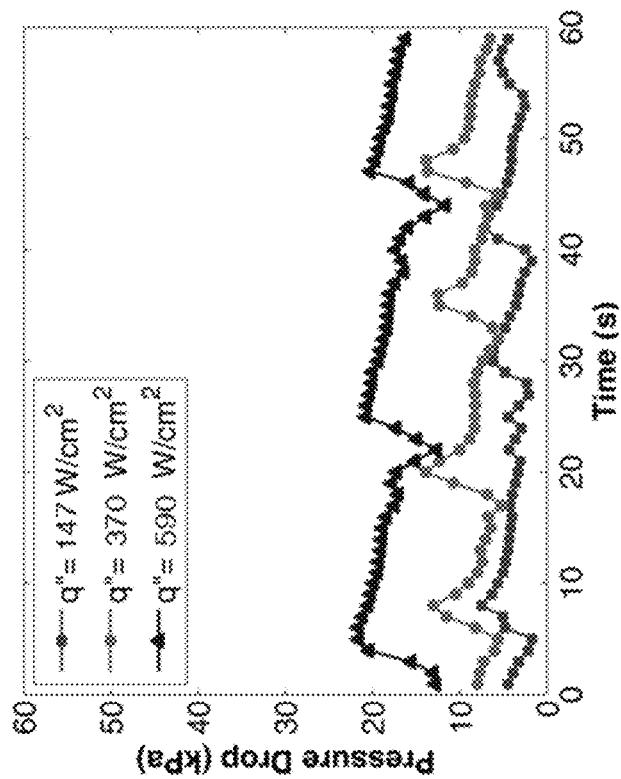
Figure 5D:
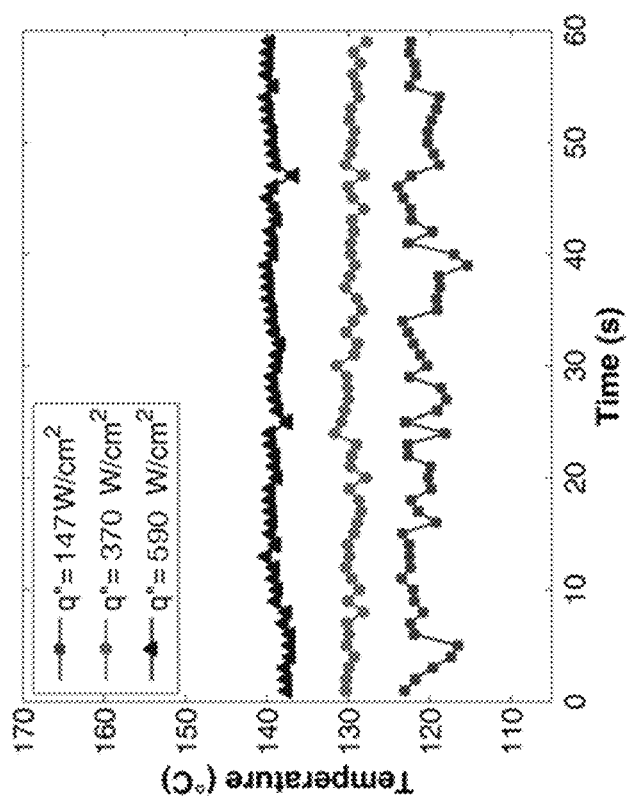

The flow boiling test rig used to investigate the effects of microstructured surfaces in microchannel flow boiling systems is shown in FIG. 4. Degassed and deionized water was used as the working fluid. Water was pumped through the loop using a peristaltic pump (Model 7553-70, Cole Parmer MasterFlex L/S). The test rig also consisted of a reservoir where the fluid was degassed and acted as a buffer to prevent flow oscillations in the microchannel test sample. The fluid reservoir was heated in order to maintain the fluid in near saturated conditions ($T_{water}$=98-100° C. for P=101.325 kPa). The pre-heater and post-heater were used to maintain a condition of minimum liquid subcool at the entrance of the test fixture. A condenser loop at the exit of the test fixture was used to bring the liquid temperature near ambient conditions due to the limitations of the peristaltic pump and the liquid flow meter (FLR1008, Omega). During the experiment, the flow rate was maintained between 20 and 27 ml/min resulting in a mass flux ranging from approximately 1350-1850 kg/m$^2$·s. All the data was recorded using a data acquisition card (6218, National Instruments) at a rate of 1000 Hz. The test fixture was placed in an inverted microscope (TE2000-U, Nikon) and the flow was captured using a high speed camera (Phantom v7.1, Vision Research).

Figure 12:
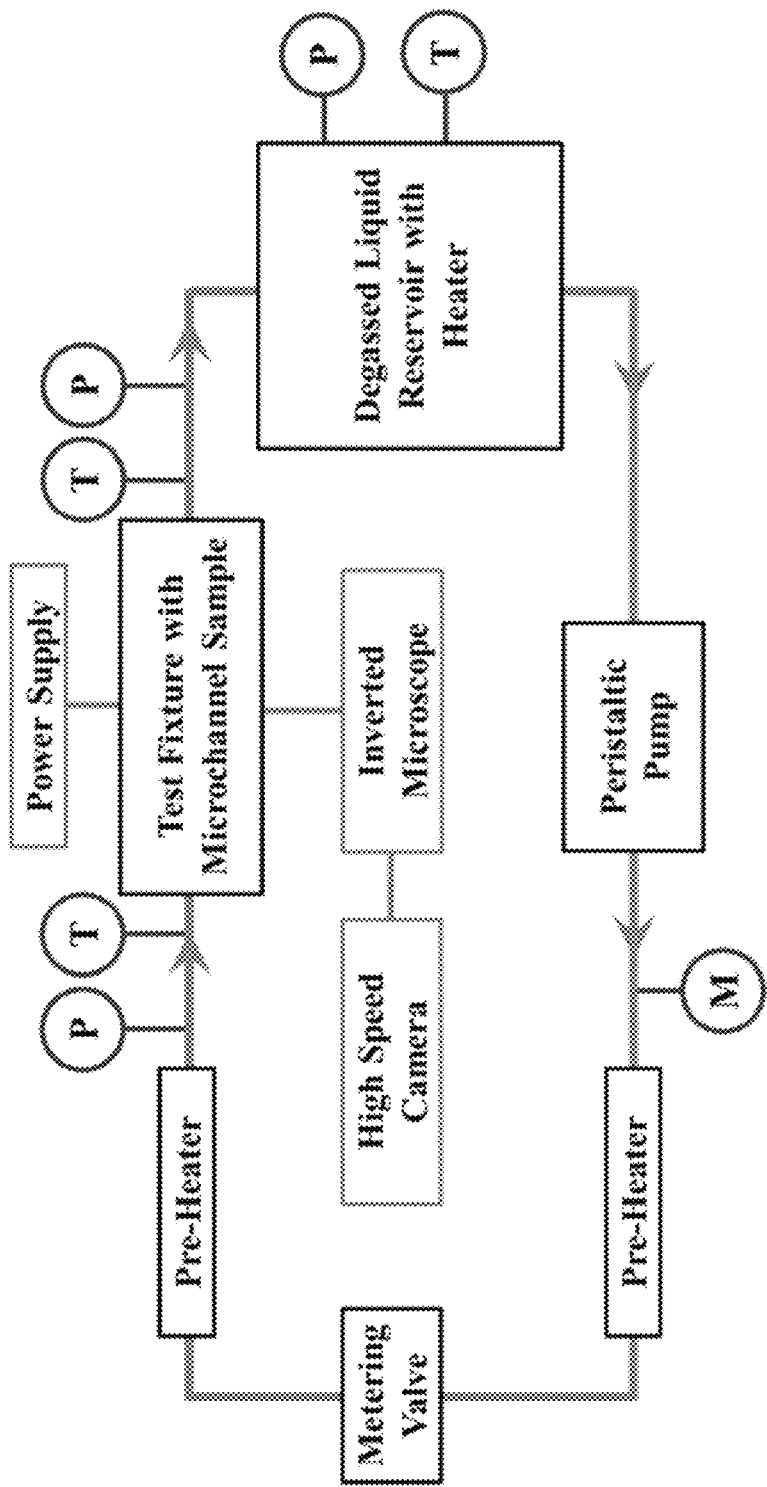
FIG. 12 is a schematic of the custom flow boiling loop.

Another example of a closed loop test rig to characterize the microchannel test devices during flow boiling is shown in FIG. 12. The loop consists of a liquid reservoir, a pump to provide a constant flow rate, a valve for flow stabilization, pre-heaters to minimize subcooling, a test fixture to interface with the test device, and various sensors. The components "P", "T" and "M" indicate locations of pressure transducers, thermocouples and the liquid flow meter respectively. Degassed and high purity water (WX0004-1, OmniSolv) was used as the working fluid. Throughout the experiment, water in the liquid reservoir was heated and degassed to saturated conditions under atmospheric pressure (Twater, res=100° C. for Pwater,res=1 atm). The fluid was pumped through the loop using a peristaltic pump (7528-30, Cole Parmer MasterFlex L/S) to avoid contamination of the working fluid and the flow rate was measured by a liquid flow meter (L-50CCM-D, Alicat Scientific). The mass flux chosen in this study was G=300 kg/m2s, which is a commonly used value in the literature. See, S. G. Kandlikar, "Fundamental issues related to flow boiling in minichannels and microchannels," Exp. Therm. Fluid Sci., vol. 26, no. 2-4, pp. 389-407, June 2002, S. G. Kandlikar, W. K. Kuan, D. A. Willistein, and J. Borrelli, "Stabilization of Flow Boiling in Microchannels Using Pressure Drop Elements and Fabricated Nucleation Sites," J. Heat Transf., vol. 128, no. 4, pp. 389-396, December 2005, A. Koşar, C.-J. Kuo, and Y. Peles, "Boiling heat transfer in rectangular microchannels with reentrant cavities," Int. J. Heat Mass Transf., vol. 48, no. 23-24, pp. 4867-4886, November 2005, and M. P. David, J. E. Steinbrenner, J. Miler, and K. E. Goodson, "Adiabatic and diabatic two-phase venting flow in a microchannel," Int. J. Multiph. Flow, vol. 37, no. 9, pp. 1135-1146, November 2011, each of which is incorporated by reference in its entirety. In addition, this moderate mass flux allowed for high heat flux dissipation at reasonable pressure drops and pumping powers. To achieve this mass flux, the flow rate was maintained at 4.5 ml/min. The flow rate fluctuations intrinsic to the peristaltic pump was reduced by using a high pump speed (~70 rpm) with the smallest pump tubing available (tube ID=0.8 mm, L/S 13, Masterflex) for the pump used in the study. However, flow rate fluctuations (±0.6 ml/min) were inevitable with the peristaltic pump at these low mass fluxes. Accordingly, a metering valve (SS-SS4-VH, Swagelok) was used to create additional hydraulic resistance (~8 kPa) for flow stabilization, and was kept at a fixed opening for all the testing. The pre-heaters (FGR-030, OMEGALUX) maintained a minimum liquid subcooling (10° C.) while also avoiding boiling at the entrance of the test fixture. Thermocouples (K type, Omega) and pressure transducers (PX319-030A5V, Omegadyne, Inc.) were used to monitor the loop conditions. The microchannel test devices were placed in an Ultem test fixture that interfaces with the loop. The test fixture was placed in an inverted microscope (TE2000-U, Nikon) and the flow was captured using a high speed camera (Phantom v7.1, Vision Research) at 2000 frames/s.

Before the experiment, the Pt heater and RTDs were annealed at 400° C. for 1 hour to avoid resistance drift. The resistance R of the heater and RTDs after annealing was approximately 275Ω at room temperature and 340Ω at 120° C. All the RTDs were calibrated in an oven and a linear correlation between the resistance and temperature was observed. The average sensitivity of the temperature with the resistance of the fabricated RTDs is $\Delta T=1.4\Delta R$. The uncertainty of the resistance measurement (~1.4Ω) resulted in an uncertainty of ±2° C. in the measured temperature. During the experiments, the microchannel was heated by applying a DC voltage across the thin-film heater. The microchannel heater was connected to a DC power supply (KLP 600-4-1200, Kepco), which was controlled using a PID algorithm in LabVIEW to maintain a constant output power. At each constant heat flux at steady state, the temperatures $T_1$ to $T_4$ measured by RTD1 to RTD4 respectively, the pressures and temperatures at the inlet and outlet of the microchannel, the flow rate, and the voltage and current across the heater were recorded for two minutes. The heat flux was then increased by an increment of approximately 20 W/cm² to the next value and the loop was left running for at least one minute to reach steady state before the data was acquired at this new heat flux. All the data was recorded using a data acquisition card (NI-PCI-6289, National Instruments) at a sample rate of 2 Hz.

The error bars in the experiments were estimated based on the uncertainty of the measurement from the instrument error and the standard deviation of multiple data points for the time-averaged data. The instrument error included the resolution of the pressure transducers (±300 Pa), the data acquisition card (±1 mV) which resulted in the uncertainty of the temperature measured by the RTDs (±2° C.), the power supply (0.06 V and 0.4 mA), and the flow meter (±1 ml/min).

Data Processing

The reported temperature values were measured at the mid-point of the microchannel backside surface by RTD3 ($T_3$), where the highest heater surface temperatures were observed. The outlet temperature was lower than the center as expected due to heat spreading in the substrate. The temperature rise $\Delta T$, obtained from the difference between the mid-point temperature and the saturation temperature of the fluid ($T_{sat}$) at this location, is $$\Delta T = T_3 - T_{sat} \tag{1}$$

To estimate the saturation temperature, the saturation pressure ($P_{sat}$) of the fluid at the mid-point location was determined as the average of the measured absolute pressure values at the inlet and outlet of the microchannel, $$P_{sat} = \frac{1}{2}(P_{in} + P_{out}) \tag{2}$$

The saturation temperature was then obtained from the NIST database using the calculated pressure $P_{sat}$. The heat flux was obtained from the input electrical power (DC voltage and current), the surface area of the channel bottom wall and accounting for the loss to the environment as, $$q'' = \frac{0.95\ UI - P_{loss}}{A_{mc}} \tag{3}$$

where U is the input voltage, I is the input current, $P_{loss}$ is the calibrated loss to the environment, $A_{mc}$ is the microchannel bottom wall surface area (500 μm×10 mm). The heat generated in the electrical connection lines to the contact pads (enclosed in the dotted line in FIG. 2a) was 5% of the total heat from the power supply. The factor of 0.95 (5% loss) in equation (3) was obtained based on the geometry of this resistance relative to the total resistance using, $$\frac{R_c}{R_{total}} = \frac{\frac{L_c}{W_c}}{\frac{L_c}{W_c} + \frac{L_{heater}}{W_{heater}}} = 0.05 \tag{4}$$

where $R_c$ and $R_{total}$ are the resistance of the connection lines and the total heater resistance, respectively, $L_c$, $L_{heater}$, $W_c$ and $W_{heat}$, are the length and width of the connection lines and the heater respectively. The temperature (at the heater surface) dependent heat loss to the environment $P_{loss}$ measured by the RTDs was obtained from experiments where the test device in the fixture was heated with the flow loop evacuated (i.e., no working fluid). A $2^{nd}$ order polynomial (close to linear) fit ($R^2=1$) between $P_{loss}$ (W) and the average microchannel backside surface temperature $T_{ave}$ (° C.) was determined from the experimental data as, $$P_{loss} = 7 \times 10^{-5} T_{ave}^2 + 0.0112 T_{ave} - 0.0457 \tag{5}$$

Since $T_2$, $T_3$ and $T_4$ are the backside surface temperatures at the inlet, mid-point and outlet of the microchannel respectively, if approximating the first half of the microchannel backside surface temperature as $0.5(T_2+T_3)$, and the second half as $0.5(T_3+T_4)$, the average microchannel backside surface temperature can be approximated as, $$T_{ave} = 0.25T_2 + 0.5T_3 + 0.25T_4 \tag{6}$$

The overall heat transfer coefficient (HTC) which includes boiling, evaporation and conduction through the bottom Si layer was calculated from the heat flux q" and the time-averaged temperature rise $\Delta T$ as, $$HTC = q''/\Delta T \tag{7}$$

Due to the unstable nature of flow boiling, $\Delta T$ typically does not capture the dynamic behavior, such as periodic dry-out, which can also cause severe transient overheating issues. Therefore CHF was defined as the heat flux beyond which the following criteria hold: (1) There is at least a 5° C. jump in $\Delta T$; (2) There is constant or periodic dry-out in terms of time-resolved temperature and pressure drop measurements and visualizations. In the case of periodic dry-out, the temperature fluctuations were larger than 20° C., the pressure drop fluctuations were larger than 2 kPa, and the duration of dry-out was longer than half the cycle time.

The stability of the measured temperature and pressure drop was compared, and the difference between the structured surface devices and the smooth surface device is discussed below. Images and videos of the bottom heated surface were used to investigate the role of surface structures in annular flow stability. Also, the boiling curve and pressure drop curve were characterized, and the heat transfer enhancement mechanism in the critical heat flux and heat transfer coefficient is discussed. Finally, the different behavior among the structured surface microchannels is explained by extension of a liquid wicking model and insights into the optimization of the micropillar geometries are provided.

Temperature and Pressure Drop Fluctuations

Typically with smooth surface microchannels, flow instability can cause temperature and pressure drop fluctuations due to the change of flow pattern and local surface dry-out. See, C.-J. Kuo and Y. Peles, "Flow Boiling Instabilities in Microchannels and Means for Mitigation by Reentrant Cavities," *J. Heat Transf.*, vol. 130, no. 7, pp. 072402-072402, May 2008, and H. Y. Wu and P. Cheng, "Visualization and measurements of periodic boiling in silicon microchannels," *Int. J. Heat Mass Transf.*, vol. 46, no. 14, pp. 2603-2614, July 2003, each of which is incorporated by reference in its entirety.

The fabricated thin film temperature sensors on the back side of the microchannels were used to measure the temperature of the heater surface ($T_{heater}$). The reported heater temperature values were measured at the mid-point of the microchannel, where the highest surface temperatures were observed. The heater temperature rise ($\Delta T = T_{heater} - T_{sat}$) was obtained from the difference between the heater temperature and the saturation temperature ($T_{sat}$) at this location. To estimate the saturation temperature at the midpoint of the channel, the saturation pressure ($P_{sat}$) at that location was calculated as the average of the absolute pressure values at the inlet and outlet of the microchannel. The saturation temperature was then obtained from the NIST database using the calculated pressure. See, E. W. Lemmon, M. L. Huber, and M. O. McLinden, *NIST Standard Reference Database* 23. National Institute of Standards and Technology, 2013, which is incorporated by reference in its entirety. Meanwhile, the input heat flux was calculated from the input electrical power (DC voltage and current), the heated surface area of the channel bottom wall (500 μm×8.5 mm) and accounting for the loss to the environment. The reported values of heat flux account for the temperature dependent heat loss from the test fixture. These temperature dependent values of heat loss were obtained from experiments where the test sample in the fixture was heated with the flow loop evacuated (i.e., no working fluid).

Small fluctuations were observed both in the measured heater surface temperature at the center of the microchannel and the pressure drop across the microchannel as shown in FIGS. 5A-5D, which correspond to the two microstructured samples listed in Table 1 for different heat flux conditions. Both samples show maximum temperature fluctuations of ±8° C. over a large range of heat fluxes. Sample D1 has temperature fluctuations within ±8° C. at a heat flux of 1026 W/cm², and ±3° C. at a lower heat flux of 164 W/cm². D2 shows fluctuations within ±4° C. at a lower heat flux of 147 W/cm², and a very steady temperature (±2° C.) at a higher heat flux (590 W/cm²). Pressure drop fluctuations for D1 vary within ±4 kPa, ±5 kPa and ±4 kPa at a mass flux of 1849 kg/m²·s and heat fluxes of 164 W/cm², 563 W/cm² and 1026 W/cm² respectively. Pressure drop fluctuations for sample D2 vary between ±3 kPa and ±5 kPa for heat fluxes between 147 W/cm² and 590 W/cm² and a mass flux of 1383 kg/m²·s. In contrast, the flat surface sample shows a significant temperature and pressure fluctuations at lower heat fluxes (q"≤454 W/cm²), and a higher heater surface temperature at high heat fluxes compared to the two samples with microstructures. However the pressure drop of the flat surface microchannel at high heat fluxes is lower. The reduced fluctuations in both temperature and pressure drop compared to previously reported data in smooth microchannels (D. Li, G. S. Wu, W. Wang, Y. D. Wang, D. Liu, D. C. Zhang, Y. F. Chen, G. P. Peterson, and R. Yang, "Enhancing Flow Boiling Heat Transfer in Microchannels for Thermal Management with Monolithically-Integrated Silicon Nanowires," *Nano Lett.*, vol. 12, no. 7, pp. 3385-3390, July 2012, which is incorporated by reference in its entirety) in addition to the measurement for a flat/smooth sample are also indicative of increased stability due to the microstructures.

Visualizations of two-phase flow for both samples (FIG. 6) also show interesting flow structures. At lower heat fluxes, nucleate boiling was not observed on the heated superhydrophilic microstructured surface, but rather only on the side walls of the microchannel (FIGS. 6A, 6B, 6D and 6E). The superhydrophilic microstructures appeared to maintain a liquid film on the bottom surface. The stable nucleation boiling on the side wall coupled with the lack of nucleation on the bottom structured surface seemed to prevent large temperature fluctuations that are typically observed in smooth surface microchannels, where boiling occurs both on the side wall and on the heated surface.

Figure 6A:
FIGS. 6A-6F are a series of images depicting flow visualization of samples D1 and D2 under different heat fluxes.
Figure 6B:
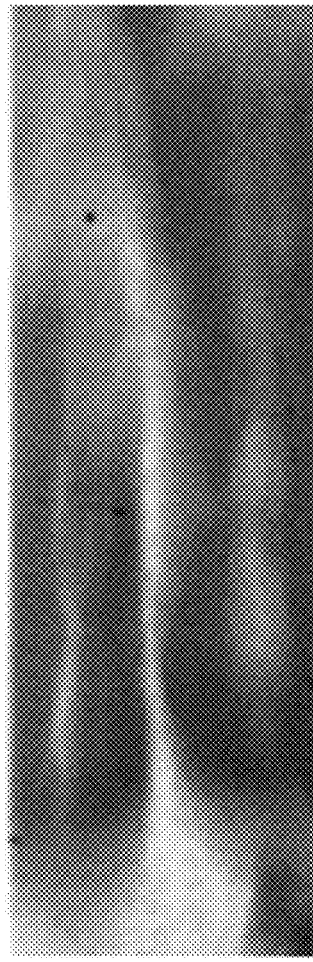
Figure 6C:
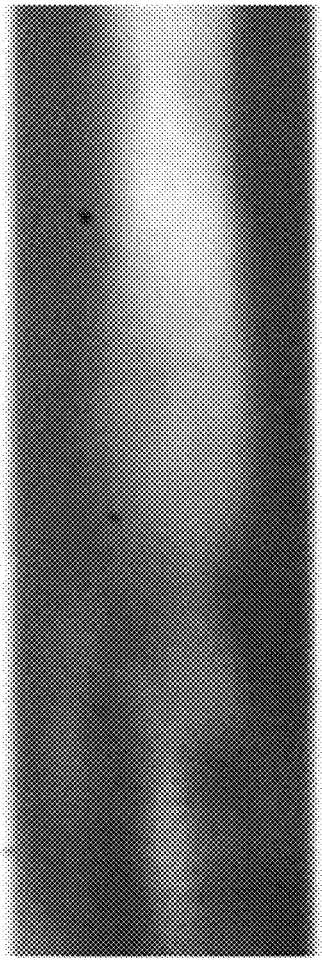
Figure 6D:
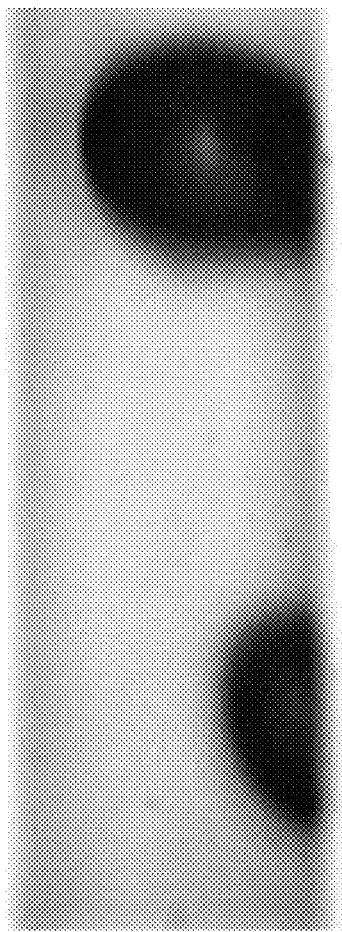
Figure 6E:
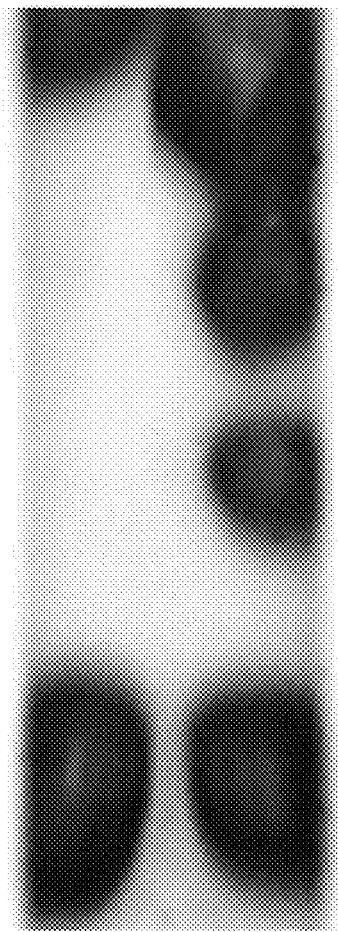
Figure 6F:
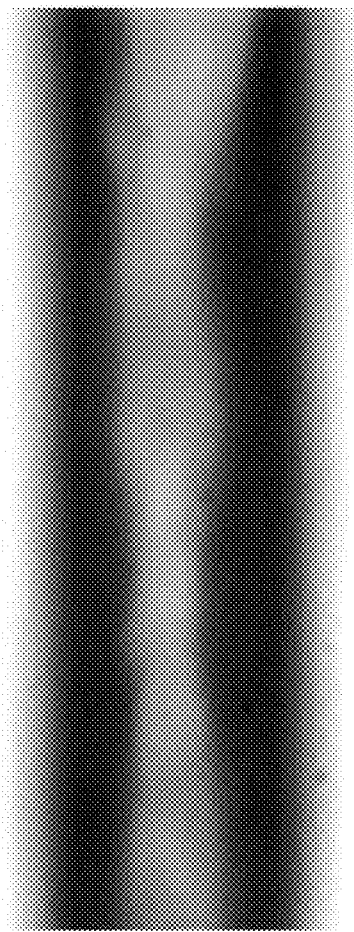

At higher heat fluxes, the flow in the microchannel appeared "churned" and highly mixed which prevented the observation of vapor bubble formation (FIGS. 6C and 6F). However the temporal temperature measurements shown in FIGS. 5A and 5C suggest similar stable flow boiling behavior compared to that at low heat fluxes. The less hydrophilic side walls facilitated nucleat boiling while the superhydrophilic microstructures with an enhanced capillary wicking capability prevented dry out and maintained a continuous flow at the bottom of the channel. At high heat fluxes when bubbles generated from the side walls merge constantly (FIG. 6C), the liquid film on the microstructures may be thin enough to aid thin film evaporation, which would further enhance the heat transfer performance. The stable thin film fluid flow sustained by the microstructure resulted in the small temperature fluctuation indicated by FIG. 5. The results suggest that the two-phase heat transfer and fluid flow behavior can be decoupled by the microstructured microchannel design, leading to increased stability. The high mixing of the flow may occur due to the high mass fluxes (>1350 kg/m²·s) used in this study. Future investigation of flow boiling in microstructured microchannels will focus on the low mass flux regimes (<500 kg/m²·s) so that bubble nucleation and departure can be characterized at higher heat fluxes and heater temperature rise as well.

Figure 13A:
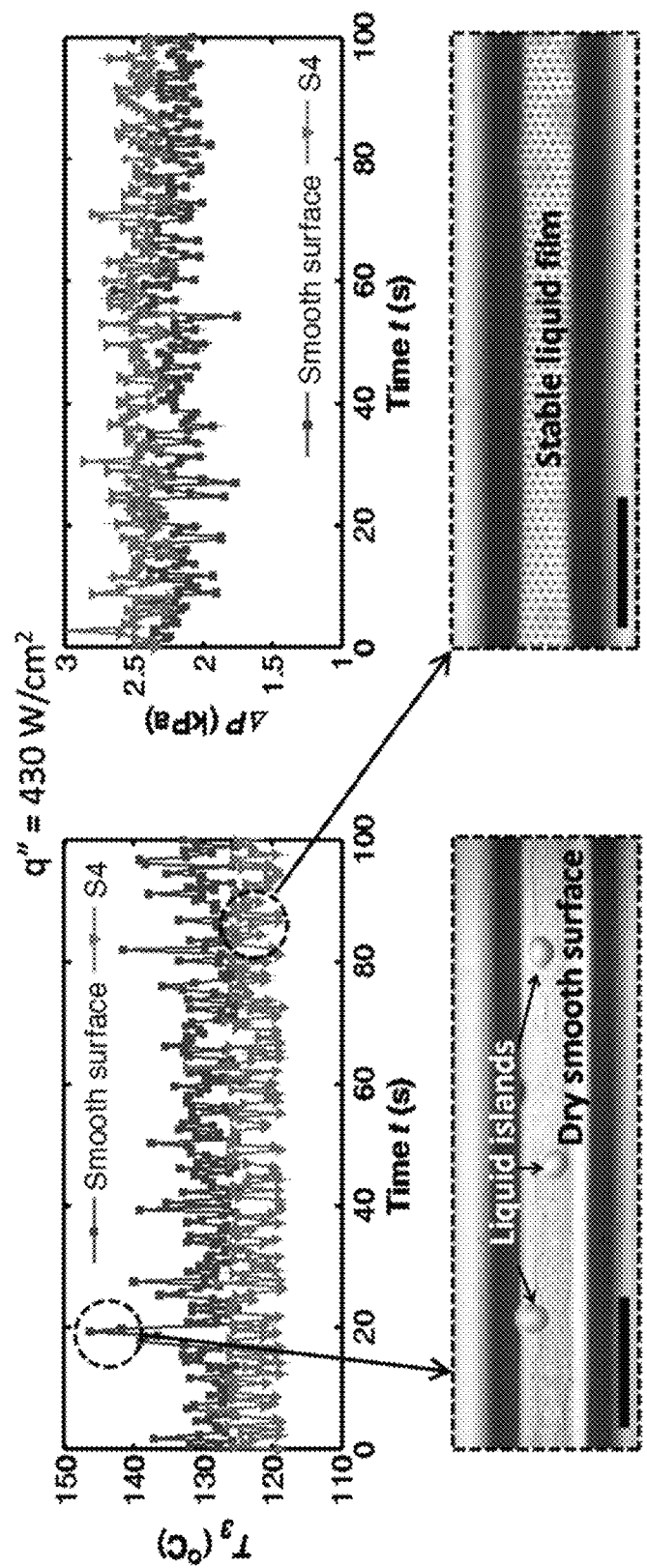
FIGS. 13A-13C are temporally resolved temperature and pressure drop, and flow visualization.

In FIG. 13, to study the effect of surface structures on flow instabilities, the temporal change in the backside surface temperature and pressure drop across the microchannels with structured surfaces were measured and compared to the fluctuations of a smooth surface microchannel. The midpoint backside surface temperature $T_3$ measured from RTD3 which was the highest temperature obtained compared to $T_1$, $T_2$ and $T_4$ was studied for this purpose. The smooth surface and the structured surface microchannels showed similar and small fluctuations at low heat fluxes (q"<400 W/cm²) for the mass flux investigated (G=300 kg/m²s), since the vapor quality was relatively low and dry-out of the thin evaporation film was less likely to occur compared to that at higher heat fluxes. As the heat flux increased to q"=430 W/cm², temperature spikes and increased pressure drop fluctuations were observed for the smooth surface microchannels (FIG. 13A). FIG. 13A insets are optical images of a smooth bottom channel surface and a structured bottom channel surface (S4). At the same heat flux, all the structured surface microchannels showed small temperature (±5° C.) and pressure drop fluctuations (±300 Pa), and the data of one representative structured surface device (S4) is shown in FIG. 13A. From the visualization of the flow (FIG. 13A), the temperature spikes of the smooth surface correspond to dry-out at the bottom microchannel surface. In contrast, flow visualization of the structured surface microchannel (FIG. 13A) indicated a stable liquid film covering the microchannel bottom surface. This stable liquid film contributed to the stability of the temperature and the pressure drop significantly. Dry-out on the structured surface occurred less frequently with shorter durations and less dry surface area compared to the smooth surface.

Figure 13B:
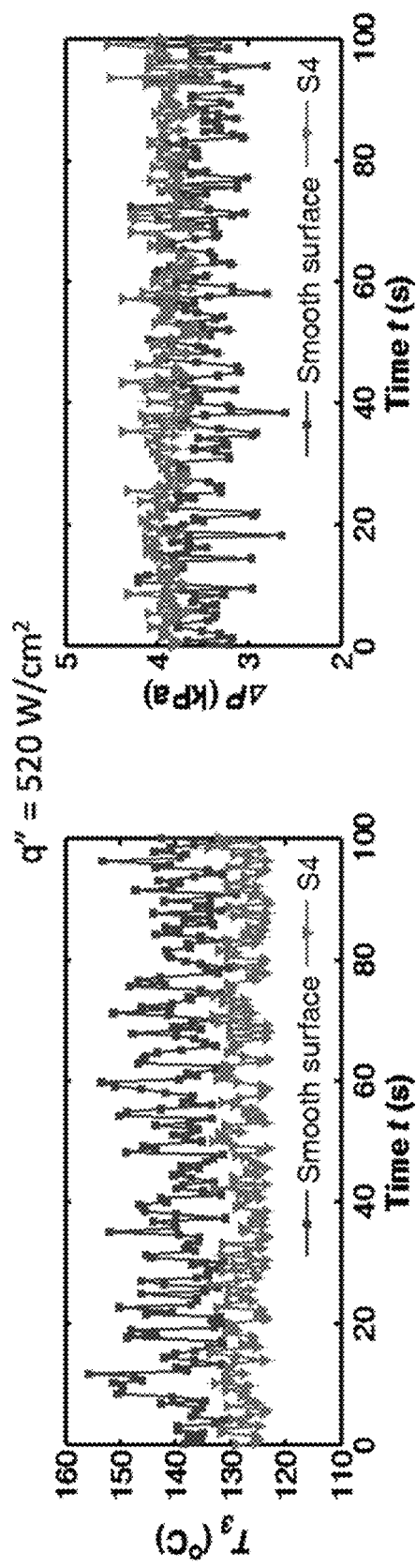
Figure 13C:
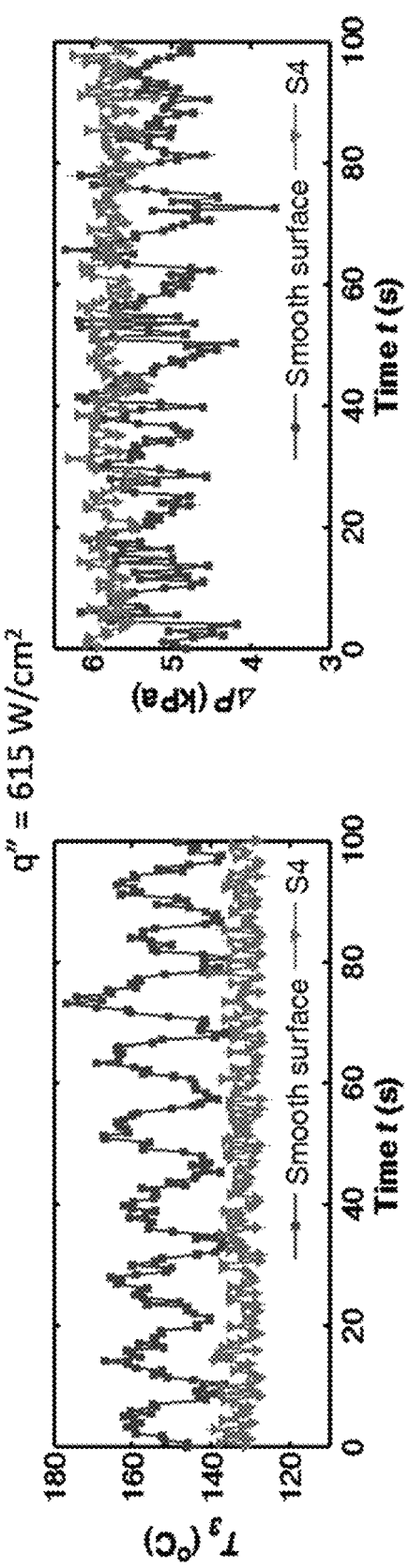
Figure 14A:
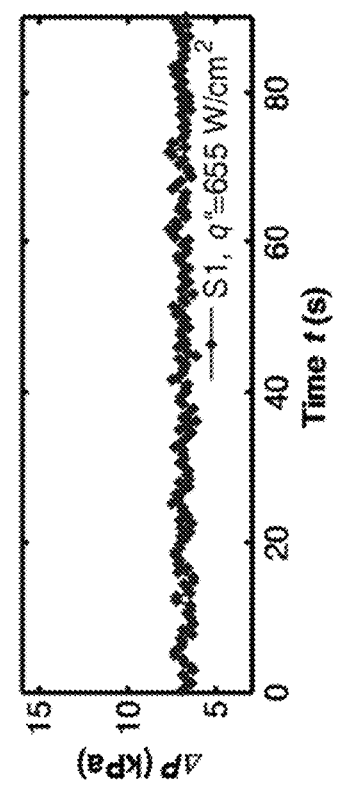
FIGS. 14A-14D are mid-point backside surface temperature $T_3$ and pressure drop $\Delta P$ fluctuations of the structured surface microchannels at CHF (the highest heat flux beyond which dry-out occurred).
Figure 14A:
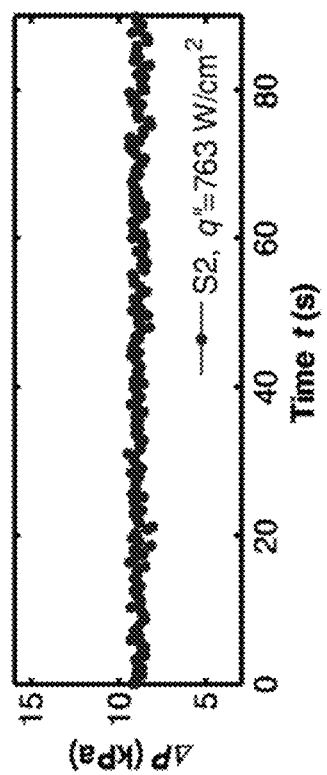
Figure 14B:
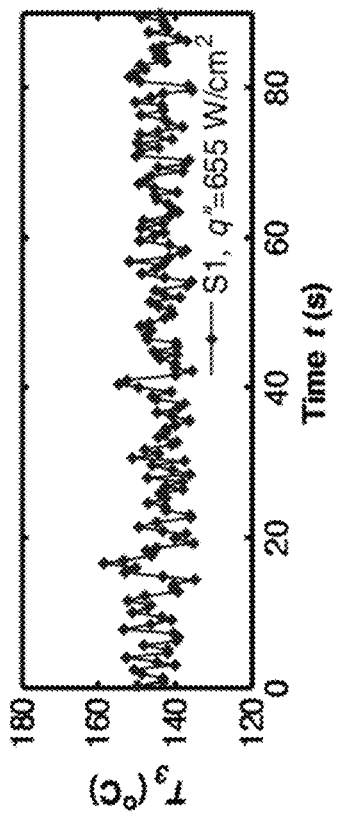
Figure 14B:
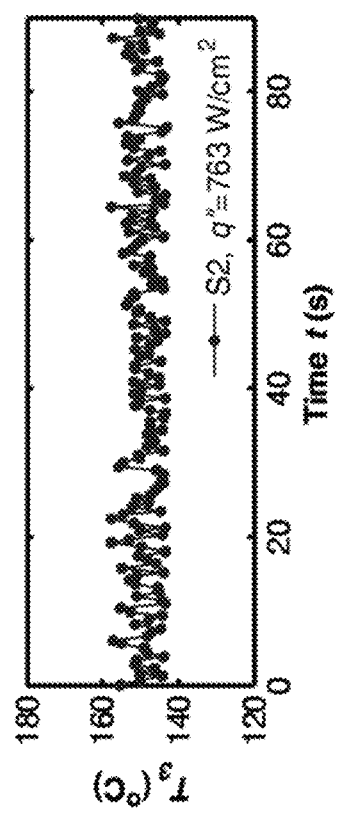
Figure 14C:
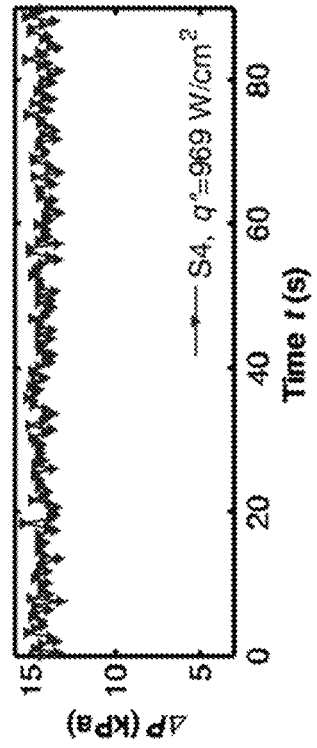
Figure 14C:
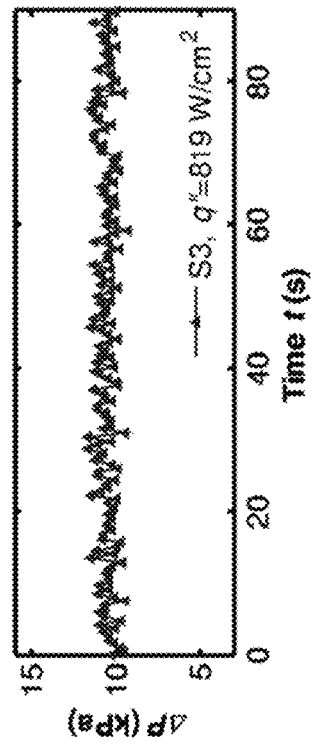
Figure 14D:
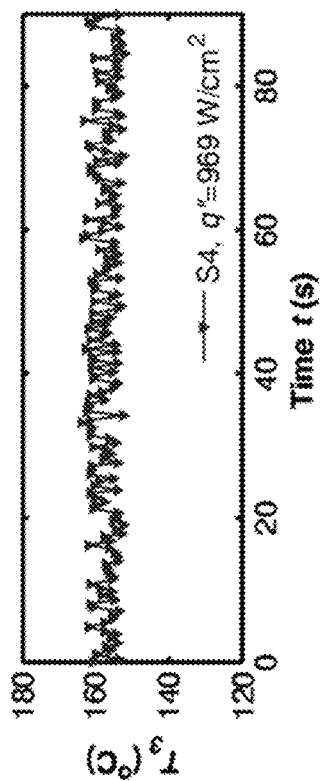
Figure 14D:
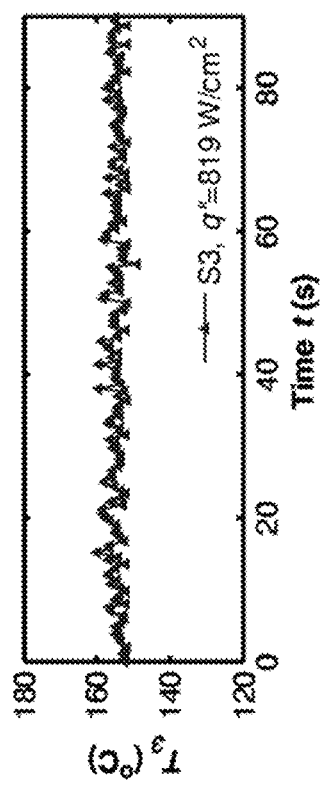

With further increases in heat flux, the temperature spikes observed on the smooth surface microchannel occurred more often and gradually developed to large amplitude (>20° C.) periodic dry-out (FIGS. 13B and 13C at q"=520 W/cm² and 615 W/cm² respectively). In comparison, the structured surface microchannel showed stable temperature (±5° C.) and pressure drop (±300 Pa) at the same heat flux (FIGS. 5b to 5c), even at CHF (±5-7° C. and ±300-600 Pa, FIG. 14). FIG. 14 shows mid-point backside surface temperature $T_3$ and pressure drop JP fluctuations of the structured surface microchannels at CHF (the highest heat flux beyond which dry-out occurred). FIG. 14A is for device S1 at q"=655 W/cm², FIG. 14B is for device S2 at q"=763 W/cm², FIG. 14C is for device S3 at q"=819 W/cm² and FIG. 14D is for device S4 at q"=969 W/cm². The mass flux G=300 kg/m²s. The uncertainties of the temperature and pressure drop measurement were approximately ±2° C. and ±300 Pa.

To further investigate the role of the structures during the dry-out process, visualizations of the flow on a smooth surface and on a representative structured surface were compared (FIG. 7, q"=430 W/cm², G=300 kg/m²s). At t=0 s both microchannels were in the annular flow regime. At t>0 s, the annular liquid volume started to reduce. Dry-out occurred first from the corners on the smooth surface (t=0.002 s), and the dry surface area expanded to the center of the microchannel (0.002 s<t<0.010 s), leaving individual liquid islands. Due to the inability to supply liquid to the surface, the smooth surface could not maintain this liquid film and thus the dry-out area expanded. The smooth surface was completely dry from t=0.012 s to 0.022 s before the liquid built up at the inlet re-flushed the channel at t=0.024 s.

Figure 15:
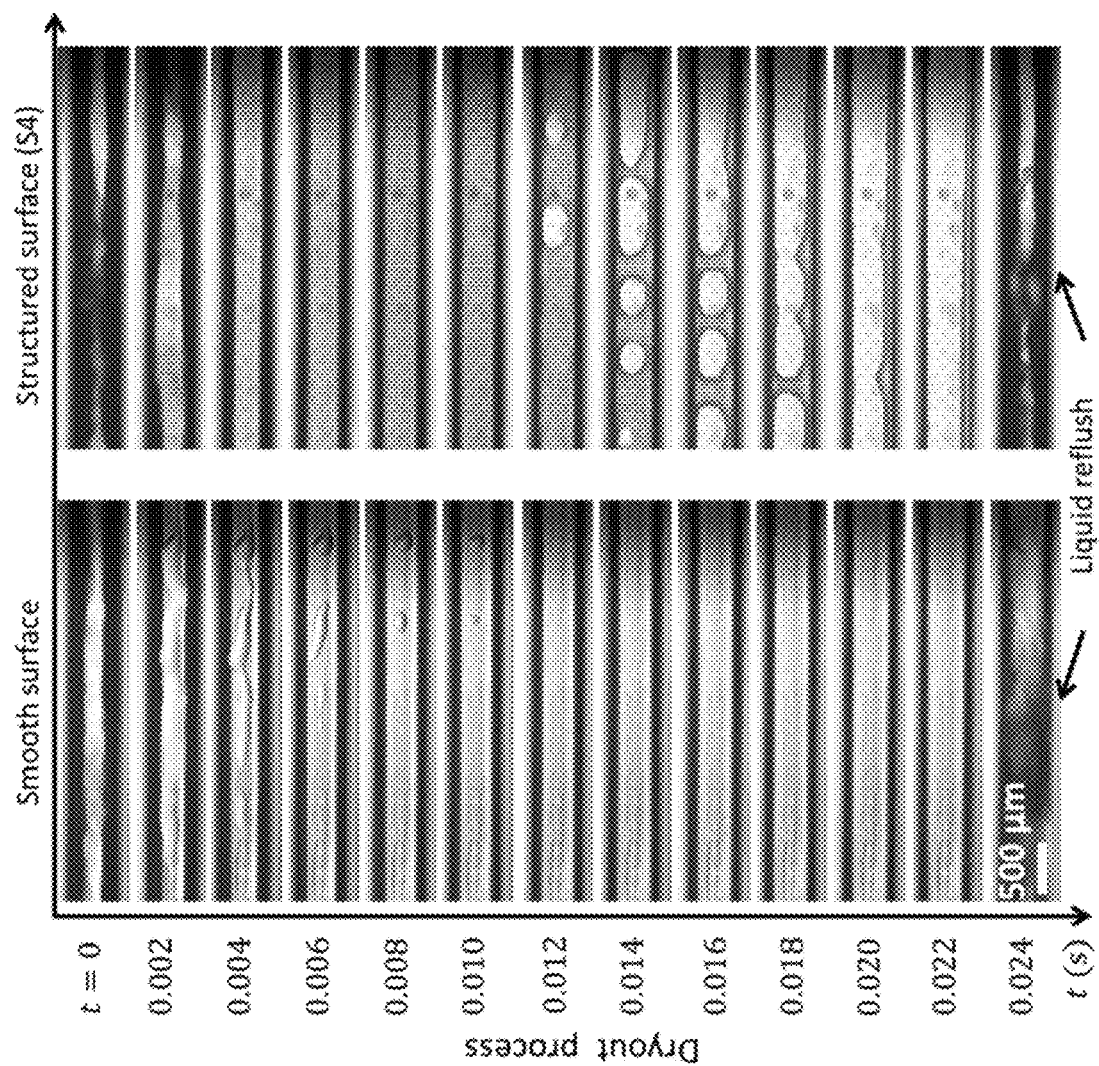
FIG. 15 is time-lapse images of the dynamic dry-out process on a smooth surface and on a structured surface (S4) captured by a high speed camera.

In comparison, the structured surface (S4) maintained the liquid film due to the wicking capability of the microstructures (0.002 s<t<0.010 s), until vapor/dry islands formed first at the center instead of the sides of the channel from 1=0.012 s (FIG. 15). The structured surface showed less dry-out spatially and temporally compared to the smooth surface due to wicking. Dry patches formed at the center of the channel which indicated wicking in the transverse direction (from the sidewalls inward). Wicking along the channel direction also existed since the dry patches formed earlier at downstream locations of the channel. This suggests that there is wicking from the sides to the center where the propagation distance is the longest. This wicking sustained the liquid film (0.002 s<t<0.010 s) and delayed dry-out (t>0.012 s). In general, the wicking from the structures prevented dry-out from occurring. In addition, the dry patches formed at downstream locations before the upstream locations, which indicate that there is also wicking along the microchannel length. From the above observations, it is evident capillarity generated with the structures plays a significant role in stabilizing the liquid thin film and the resulting surface temperature.

Heat Transfer Performance Characterization

Figure 8:
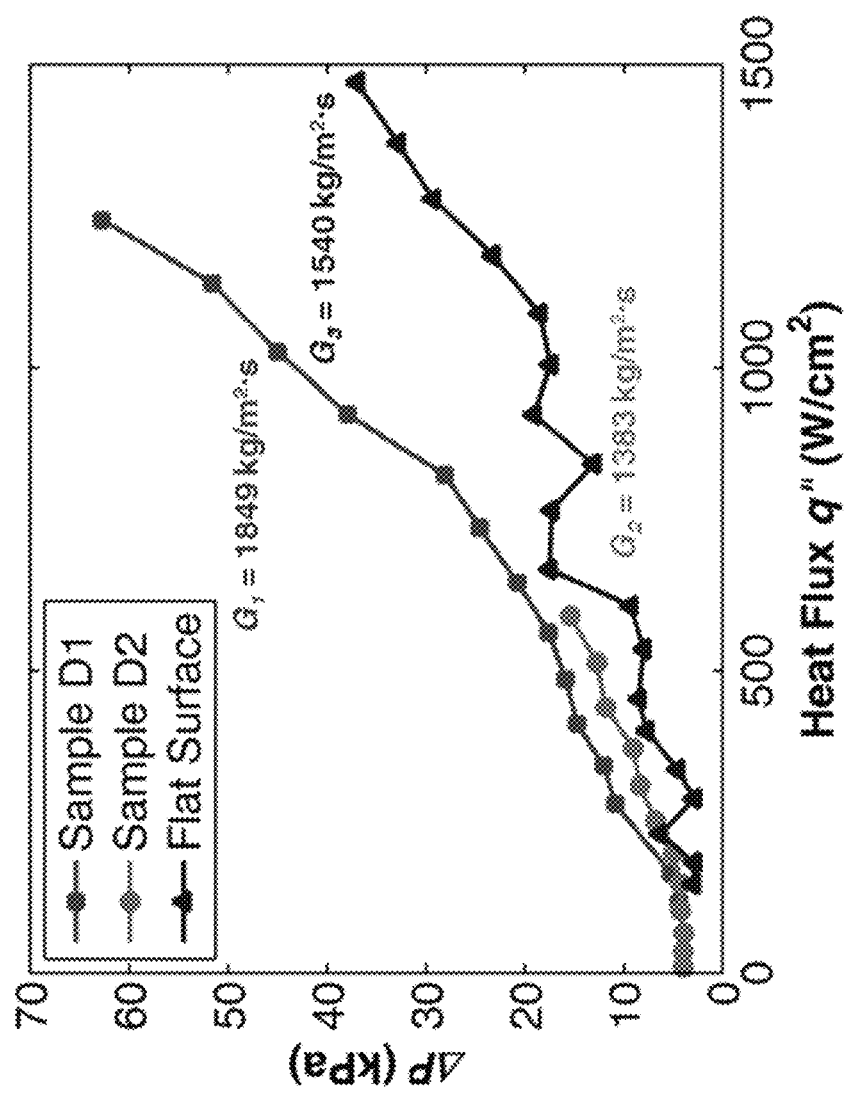
FIG. 8 is a graph depicting pressure drop across the microchannel as a function of heat flux.

The time-averaged heat transfer performance of the structured surface microchannels was also characterized The heat flux q" calculated by equation (3) as a function of the time-averaged mid-point backside surface temperature rise ΔT (equation (1)) for the four microstructured surface devices (Table 2) and the smooth surface device investigated, as shown in FIG. 8a (i.e., the boiling curves) were compared. The y-axis intercept (~50 W/cm²) at ΔT=0° C. was mainly due to the 10° C. subcooling, which agrees well with the estimated heat flux due to subcooling $q"_{subcooling}=\dot{m}c_p\Delta T_{subcooling}/A_{mc}=63$ W/cm². The low-slope in the curves at q" below 150 W/cm² was due to single phase heat transfer where the onset of nucleate boiling was indicated by the sudden drop in ΔT. After the onset of nucleate boiling, the temperature rise increased with the heat flux.

Figures 7A, 7B:
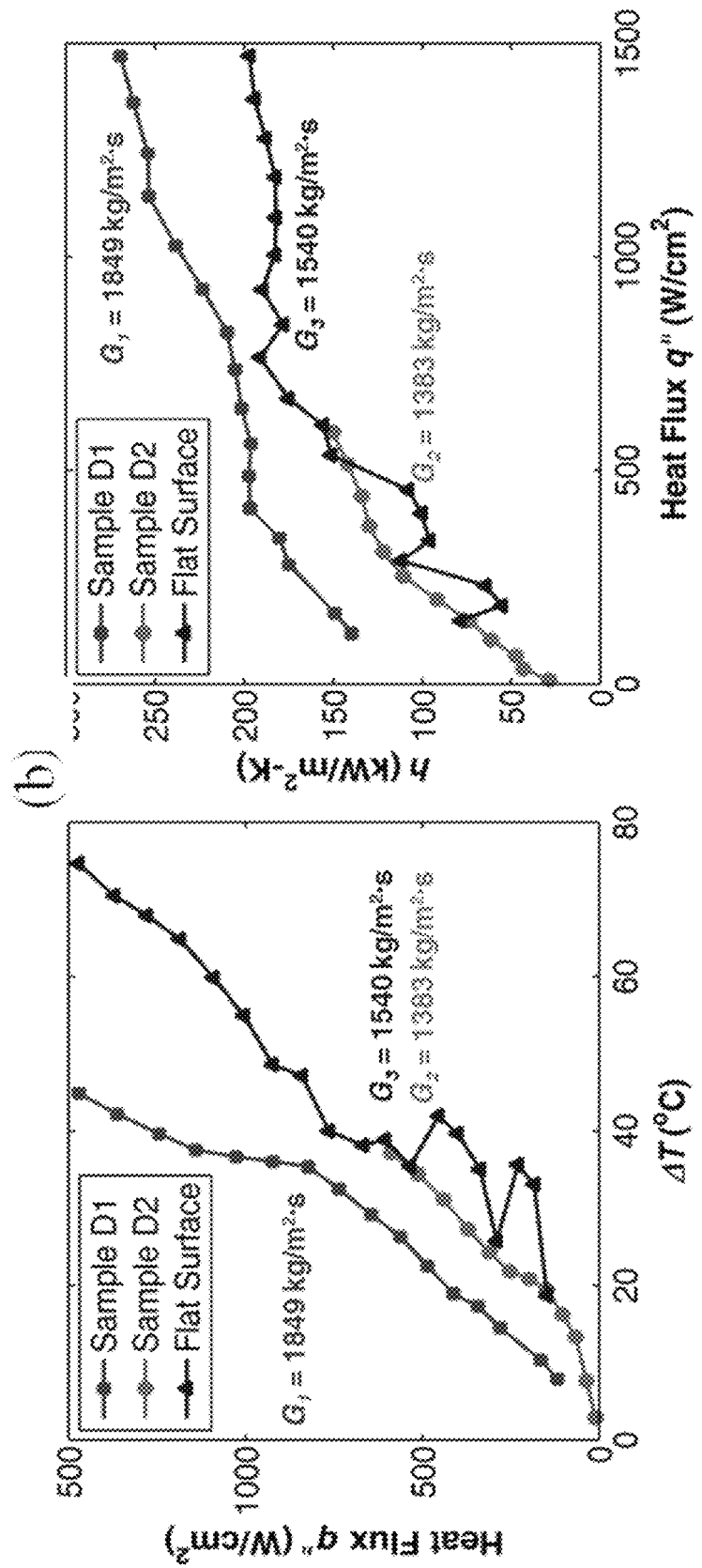
FIGS. 7A and 7B are graphs depicting the heat transfer characteristics of the microchannel.

FIG. 7A compares the heat flux through the bottom microstructured surface of the microchannel as a function of the heater temperature rise for the two microstructured surface samples (Table 1) and the flat surface sample investigated. It is important to note that the maximum heat flux values shown in the boiling curve in FIG. 7A for the microstructured surface samples (D1 and D2) are not the CHF values. Heater burnout/failure was observed for these samples due to fabrication associated defects, which prevented the investigation of CHF. A maximum heat flux of 1470 W/cm² was observed for sample D1 at a heater temperature rise of about 45° C. Compared to flat surface microchannel, the boiling curves of the structured surface microchannels are smooth, which indicates reduced instability. The higher slope for the q" with ΔT curves for sample D1 indicates a higher heat transfer coefficient value for this sample. This result is evidenced in FIG. 7B where the heat transfer coefficient (h) is plotted as a function of the heat flux. The maximum heat transfer coefficient of 269 kW/m²·K was demonstrated with sample D1 at a heat flux of 1470 W/cm², which is a 37% improvement compared to the flat surface microchannel. In contrast, the flat surface sample has higher temperature rise at high heat fluxes, and the heat transfer coefficient fluctuates at low heat fluxes. The enhanced heat transfer coefficient is due to the decoupling of the boiling heat transfer and fluid flow, which facilitates a stable thin liquid film on the heated microstructures as well as constant nucleate boiling from the side walls.

In FIG. 13A, The red arrows in the boiling curves indicate the CHF. The structured surface microchannels had a clear transition at CHF, which can be seen by the sudden drop in the boiling curve slope after CHF. The time-resolved temperature and pressure drop were also very stable before and at CHF (FIG. 14). In contrast, the smooth surface microchannel had a less obvious transition to CHF, since periodic dry-out occurred much earlier on the boiling curve from q"=430 W/cm², as indicated by the temperature spikes (FIG. 13). The large error bars of 4 T for the smooth surface devices at high heat fluxes were also due to the increasing temperature oscillations (FIG. 13A). This resulted in a higher time averaged temperature rise under the same heat flux compared with the structured surface microchannels and thus a gradual decrease in the boiling curve slope. As the heat flux increased, flow instabilities (temperature spikes and pressure drop oscillations) developed to large amplitude periodic dry-out or constant dry-out (longer than one minute).

Figure 16B:
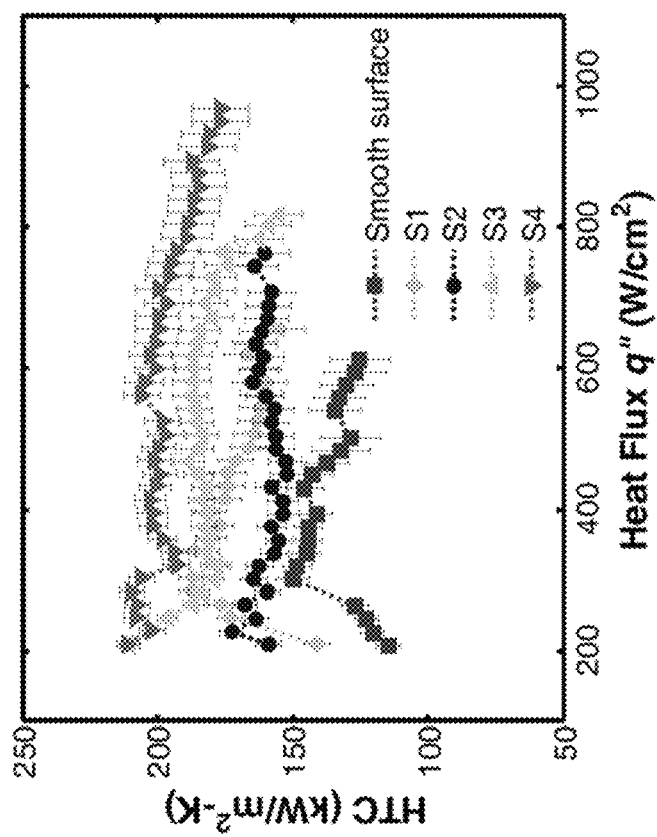
FIGS. 16A and 16B are graphs depicting the heat transfer performance characteristics of the microchannel.
Figure 16A:
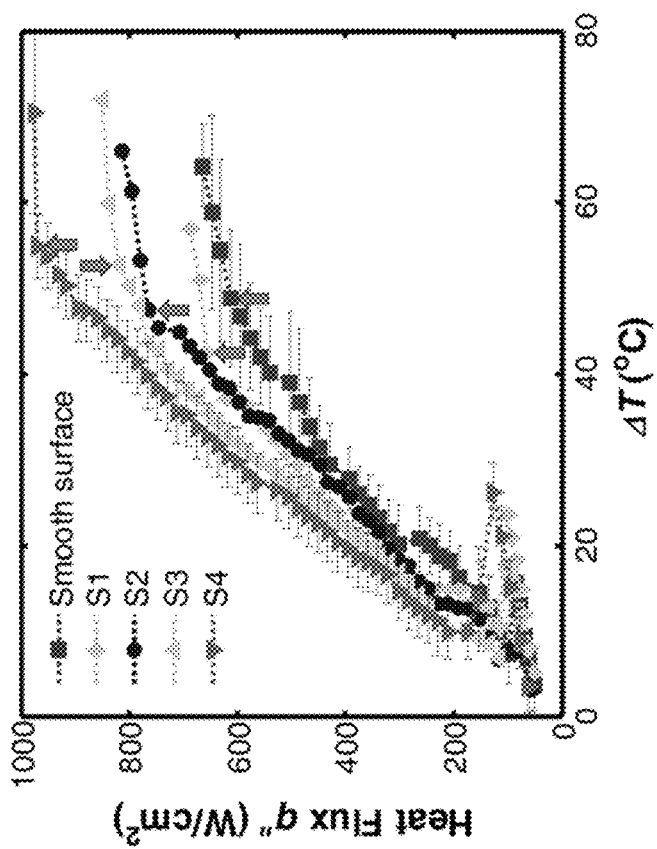

The structured surface showed an enhanced CHF with a maximum value of 969 W/cm$^2$ at a corresponding vapor quality $\chi$ of 0.29 achieved by device S4, which is a 57% enhancement compared with that of the smooth surface microchannel (615 W/cm$^2$ at $\chi$=0.19). This CHF value is significant in comparison with similar studies in literature for a mass flux G of 300 kg/m$^2$s. FIG. 16 shows the heat transfer performance characteristics of the microchannel. FIG. 16A shows the boiling curve (heat flux q" vs. heater temperature rise $\Delta$T). $\Delta$T and q" were calculated by equation (1) and (3) respectively. The red arrows indicate the CHF. FIG. 16B shows the HTC which were obtained from FIG. 16A and equation (7)) as a function of q". The error bars for q" were approximately ±1%. The error bars for $\Delta$T were approximately ±3.5° C. for the structured devices (shown for S4) and grew with the heat flux due to the increasing temperature oscillations (±3.5° C. to ±11° C.) for the smooth surface. The structured surface microchannels showed significantly enhanced HTC even at heat fluxes close to CHF. This is due to the fact that evaporation is dominant in the annular flow, and the structures facilitate a stable liquid film and the menisci increased the thin film area. The HTC of the structured surface devices were relatively constant, which indicates that dry-out was minimized by the structures and the thermal resistance remained relatively unchanged.

Pressure Drop

To complement the two-phase heat transfer characteristics, the hydrodynamic characteristics of the microchannels were also studied. A limiting factor in the implementation of flow boiling systems is the pumping cost penalty that must be paid to sustain efficient heat transfer conditions. See, W. Qu and I. Mudawar, "Measurement and prediction of pressure drop in two-phase micro-channel heat sinks," Int. J. Heat Mass Transf., vol. 46, no. 15, pp. 2737-2753, July 2003, which is incorporated by reference in its entirety. To study the pressure drop in the microchannel, the pressure was measured at the inlet and outlet of the channel. The average pressure drop measured over 300 seconds is plotted as a function of the heat flux in FIG. 8. From FIG. 8, under the same heat flux the pressure drop of sample D1 is greater than sample D2. When comparing the low permeability of the structures (Table 1) to the infinite permeability of the microchannel, the contribution of the pressure drop in the microstructures to the overall hydrodynamic pressure drop is negligible. Hence even though the two samples have similar values of permeability, the higher observed pressure drop in sample D1 is due to the higher mass flux. In comparison with alternative methods of heat transfer and flow stability enhancement in microchannel thermal management devices, like inlet flow restrictors and cavities (see, for example, A. Koşar, C.-J. Kuo, and Y. Peles, "Suppression of Boiling Flow Oscillations in Parallel Microchannels by Inlet Restrictors," J. Heat Transf., vol. 128, no. 3, pp. 251-260, September 2005, which is incorporated by reference in its entirety), the ability to maintain a stable liquid film on the heated surface through microstructures aids enhanced stability through the channel without the penalty of additional microchannel pressure drop. However the pressure drop of the flat surface sample is lower compared to the structured surface samples. The pressure drop at different mass fluxes and heat fluxes especially close to CHF condition will be further studied in the future work.

Figure 17:
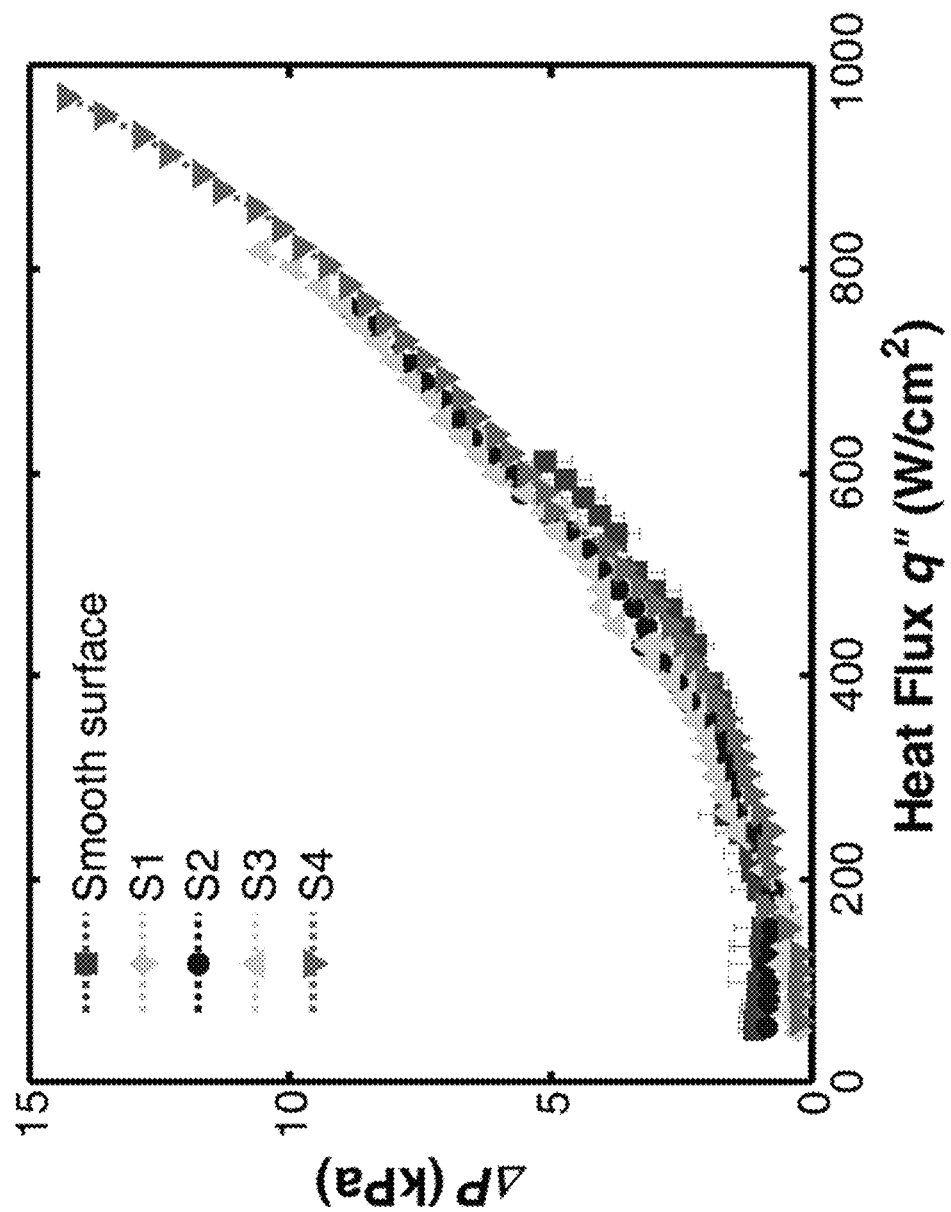
FIG. 17 is a graph depicting pressure drop across the microchannel as a function of heat flux for the devices investigated.

FIG. 17 shows the measured time-averaged pressure drop as a function of heat flux q". The data were plotted until CHF. Error bars in pressure were approximately ±430 Pa (shown for the smooth surface microchannel), which were calculated from the standard deviation of the temporal pressure measurement and the accuracy of the pressure transducers. The pressure drops across all devices were similar, which indicates that the additional pressure drop introduced by the surface structures in this study were negligible. The maximum $\Delta$P was 14.3 kPa for device S4 at q"=969 W/cm$^2$ and G=300 kg/m$^2$s, which resulted in a negligible pumping power of $P_{pump}$=Q$\Delta$P=1 mW, where Q is the volumetric flow rate (m$^3$/s). This implies that the structures did not cost more pumping power while they maintained the temperature stability and enhanced heat transfer. This result is attributed to the liquid-vapor interface only forming menisci within the structures when there is insufficient liquid supply (FIG. 9C) which is usually at the downstream section of the microchannel. In the devices tested, there was sufficient liquid supply upstream such that the majority of liquid was on top of the structures and the structures only acted as surface roughness and did not introduce noticeable extra viscous pressure drop. In addition, wicking from the sidewalls to the center of the bottom surface as discussed in Section 3.1 did not contribute to the pressure drop along the microchannel direction.

Wicking Model

To further support the explanation for the role of the micropillar geometries in the wicking performance, the transverse liquid propagation flow rate (from the side walls to the center) was predicted in the micropillar arrays (FIG. 9C) using an adiabatic (no phase-change) wicking model developed by R. Xiao, R. Enright, and E. N. Wang, "Prediction and Optimization of Liquid Propagation in Micropillar Arrays," Langmuir, vol. 26, no. 19, pp. 15070-15075, October 2010, which is incorporated by reference in its entirety. The model solves the 1-D Brinkman equation to obtain the liquid velocity in porous media. Details of the model framework are listed in the next section, which gives the velocity profile, $$u = Ae^{\alpha\sqrt{\varepsilon}\, y} + Be^{\alpha\sqrt{\varepsilon}\, y} - \frac{1}{\alpha^2 \mu}\frac{dP}{dx} \qquad (8)$$

where u is the velocity, dP/dx is the pressure gradient which drives the liquid flow, $\mu$ is the viscosity of the liquid, $\varepsilon$ is the porosity of the micropillar arrays, and $\alpha^{-2}$ is the permeability that accounts for the drag introduced by porous media, A and B are constants listed in the next section.

Figure 18:
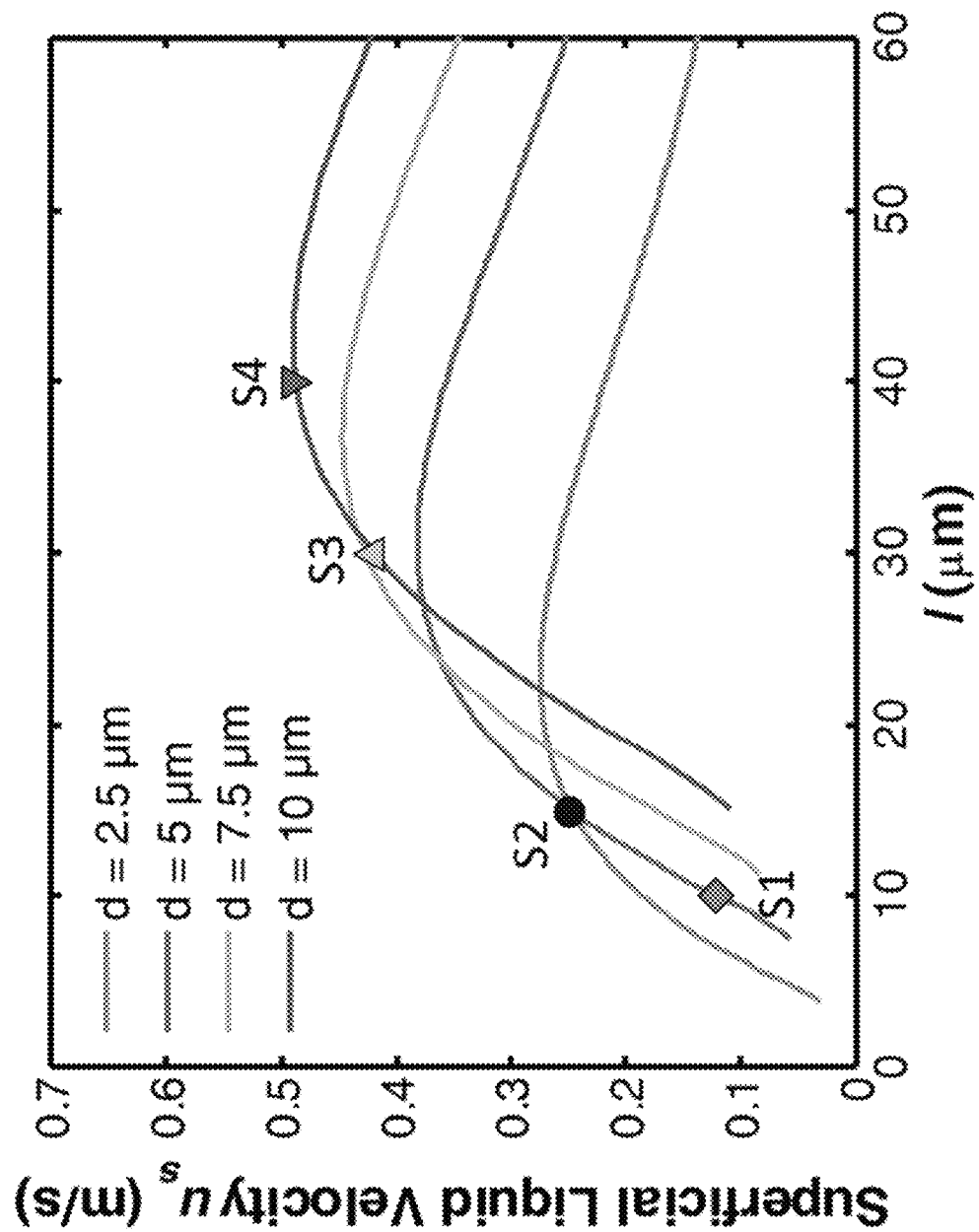
FIG. 18 is a graph depicting the superficial liquid wicking velocity $u_s$ as a function of the diameters d and pitches l of the micropillars, when the height h is fixed.

To estimate the driving pressure gradient dP/dx in equation (8) for this study, it is assumed that (1) the dry-out location has the largest meniscus curvature k (i.e., minimum radius of curvature r=1/k, FIG. 1c) since the liquid level is the lowest. Therefore the liquid pressure is the lowest at the dry-out point based on the Young-Laplace equation ($P_{cap}$=$P_{vapor}$−$P_{liquid}$=2$\sigma$/r); (2) at the dry-out location, the contact angle of water on silicon dioxide (pillar surface) is the receding contact angle $\theta_r$ ($\theta_r \approx 15°$ (see, R. Raj, S. C. Maroo, and E. N. Wang, "Wettability of Graphene," Nano Lett., vol. 13, no. 4, pp. 1509-1515, April 2013, which is incorporated by reference in its entirety); (3) the pressure gradient is approximated as dP/dx=($P_{max}$−$P_{min}$)/$L_w$, where $P_{max}$ is the maximum pressure along the wicking path which is at the sidewalls ($P_{max} \approx P_{vapor}$) since the curvature is approximately zero, $P_{min}$ is the pressure at the dry-out location ($P_{min}=P_{vapor}-2\sigma/r$), and $L_w$ is the wicking distance. From above, $dP/dx=P_{cap}/L_w$; (4) $P_{cap}$ is derived using a force balance on the liquid-vapor interface, $P_{cap}(l^2-0.25\pi d^2)=\gamma\pi d \cos\theta_r$; (5) the longest wicking distance is from one sidewall to the other sidewall since dry-out can happen at random locations, so maximum $L_w$=W, where W is the width of the microchannel (W=500 µm). With these assumptions, the average superficial liquid wicking velocity $u_s$ which is proportional to the flow rate of the wicking liquid film was calculated, $$u_s = \varepsilon\frac{1}{h}\int_{y=0}^{y=h} u\,dy \quad (9)$$

where the height h is fixed (h=25 µm). The result is shown in FIG. 18, where $u_s$ is plotted as a function of l and d. The geometries of the micropillars investigated in this study are also shown in symbols in FIG. 18 (device S1 to S4). FIG. 18 shows the superficial liquid wicking velocity $u_s$ as a function of the diameters d and pitches l of the micropillars, when the height h is fixed (h=25 µm). $u_s$ is calculated by equation (9), and the magnitude of $u_s$ is proportional to the flow rate of the wicking liquid film in the pillar arrays. The symbols on the curves mark the locations of the geometries of the micropillars investigated here.

By comparing the results in FIGS. 18 and 16A, the microstructures that led to a higher superficial liquid wicking velocity also had a higher CHF. This positive correlation between wicking velocity and CHF is expected based on the proposed mechanism, since efficient liquid transport helped sustain the thin film evaporation and prevent dry-out. FIG. 10 also indicates that the wicking velocity depends both on the capillary pressure which creates the driving pressure gradient, and the viscous resistance, which hinders effective liquid propagation. Both terms depend on the structure geometry. Specifically, the capillary pressure scales with 1/l, and the viscous drag scales with $1/l^2$, thus as l decreases the drag force increases faster than the driving capillary pressure. This is the reason device S1 has lower wicking velocity even though it has higher capillary pressure due to smaller spacing compared to device S4, because the increased viscous resistance is more significant than the increase of the pressure gradient. In fact, the geometry of the structures can be further optimized to maximize the wicking capability, and hence enhance the flow stability and heat transfer.

While this wicking model explains the trends of these results, there are limitations. The effects of evaporation and the shear stress along the channel direction on the meniscus shape were not accounted for. Since the pressure gradient is related to the local meniscus shape (local curvature), the assumption of a linear pressure gradient needs further validation. In addition, liquid wicking along the microchannel direction is also important in determining CHF. However evaporation and shear stress along the microchannel direction needs to be considered. A more comprehensive model which accounts for evaporation and wicking in both lateral and axial direction needs to be developed in the future to provide more detailed understanding of the role of surface structures on flow boiling.

Wicking Model Framework

The model by Xiao et al. minimizes surface energy to predict the equilibrium liquid-vapor interface meniscus shape and thus the capillary pressure generated by the pillar arrays. The liquid velocity profile was analytically solved using the one-dimensional form of the Brinkman equation (see, H. C. Brinkman, "A calculation of the viscous force exerted by a flowing fluid on a dense swarm of particles," Appl. Sci. Res., vol. 1, no. 1, pp. 27-34, December 1949, which is incorporated by reference in its entirety) as shown in equation (A1), which is a modified form of the Navier-Stokes equation including a Darcy term to study flow through porous media.

$$\mu\frac{d^2u}{dy^2}-\varepsilon\frac{dP}{dx}-\mu\alpha^2\varepsilon u=0 \quad (A1)$$

In equation (A1), u is the velocity, dP/dx is the pressure gradient which drives the liquid flow, µ is the viscosity of the liquid, ε is the porosity of the micropillar arrays, and $\alpha^{-2}$ is the permeability that accounts for the drag introduced by porous media. The micropillars were regarded as porous media with permeability numerically studied by Sangani and Acrivos [42], and the expression is given by, $$\alpha^{-2}=l^2\frac{\ln c^{-\frac{1}{2}}-0.738+c-0.887c^2+2.038c^3+O(c^4)}{4\pi} \quad (A2)$$

where $c=\pi d^2/4l^2$ is the solid fraction, assuming no slip boundary condition (u=0) at y=0 (bottom surface) and a shear free boundary condition at the pillar tops (du/dy=0 at y=h=25 µm, where h is the height of the pillars). Since the wicking process was models only in the cross sectional plane (from the sidewalls inwards), it is reasonable to neglect shear at y=h in the lateral direction, since the shear force is mainly along the channel direction due to the vapor flow.

With the boundary conditions, the velocity field is expressed as equation (8), where the constants A and B in equation (8) are, $$A=\frac{\frac{dP}{dx}\exp(-\alpha h\sqrt{\varepsilon})}{\alpha^2\mu[\exp(\alpha h\sqrt{\varepsilon})+\exp(-\alpha h\sqrt{\varepsilon})]} \quad (A3)$$

$$B=\frac{\frac{dP}{dx}\exp(\alpha h\sqrt{\varepsilon})}{\alpha^2\mu[\exp(\alpha h\sqrt{\varepsilon})+\exp(-\alpha h\sqrt{\varepsilon})]} \quad (A4)$$

In summary, the design of a two-phase microchannel incorporated with microstructured surfaces, a backside heater and temperature sensors can be used as a platform to systematically study surface geometry effects on flow boiling in microchannels. The design decouples thin film evaporation and nucleation by promoting capillary flow on the bottom heated surface while facilitating nucleation from the sidewalls. The structures reduced flow boiling instability significantly in the annular flow regime, and achieved very stable surface temperature and channel pressure drop even at high heat fluxes close to CHF. The smooth surface showed frequent temperature spikes and pressure drop fluctuations due to dry-out, which developed gradually to CHF. Visualization of the flow pattern and the dry-out process indicates that the micropillar surface can promote capillary flow and increase flow stability by maintaining a stable annular flow and high-performance thin film evaporation. This stabilized annular flow and thin film evaporation contributed to an enhanced HTC and CHF (maximum 57%) compared to a smooth surface microchannel. The pressure drop across all devices was similar, which indicates that the additional pressure drop introduced by the surface structures in this study was negligible. A liquid wicking model in the transverse direction of the channel was developed to explain the trend in the enhancement of CHF among the structured devices. The experimental data showed a significant heat dissipation capability through the structured surface microchannel (q"≈1470 W/cm$^2$ and h≈2.7×10$^5$ W/m$^2$ K) with small temperature fluctuations (±3-8° C.). The enhanced performance and reduced temperature fluctuations support the idea of using structured surfaces to mitigate flow instability and increase heat transfer performance. The increased flow and thermal stability is due to the fact that the structures, with an enhanced capillary wicking capability, help maintain a liquid film on the heated surface. The sample with the smaller diameter and spacing of the microstructures showed a higher heat transfer coefficient. With these microchannel designs, two-phase heat transfer and fluid flow behavior can be decoupled. Bubbles are generated via the less hydrophilic sidewalls while the superhydrophilic microstructures at the bottom of the channel help postpone dry out. This insight provides an opportunity to design two-phase microchannel heat sinks for high heat flux thermal management applications. Both the experimental results and the model suggest that the micropillar geometry can be further optimized to enhance the rewetting capability and prevent dry-out on the microchannel surface by accounting for the balance between capillary pressure and viscous resistance. The best heat transfer performance is indicative of this optimal geometry. Operating fluids with different thermo-physical properties, heat transfer performance at higher vapor qualities and the enhancement of CHF due to the microstructures can be further optimized. This will aid in the understanding of how microstructured surfaces delay dry-out to further augment the heat transfer coefficient and suppress instabilities.

Nomenclature $A_{mc}$=microchannel bottom wall surface area
$c_p$=specific heat of water
d=diameter of the micropillar
G=mass flux in the microchannel
h=height of the micropillar
I=input current from the power supply
k=curvature of the meniscus
$L_c$=length of the electrical connection resistance
$L_{heater}$=length of the heater resistance
$L_w$=wicking distance
l=pitch of the micropillar
ṁ=mass flow rate
$\Delta P$=pressure drop across the microchannel
$P_{cap}$=capillary pressure
$P_{in}$=microchannel inlet pressure
$P_{liquid}$=liquid pressure
$P_{loss}$=calibrated heat loss to the environment
$P_{out}$=microchannel outlet pressure
$P_{pump}$=pumping power
$P_{sat}$=saturation pressure
$P_{vapor}$=vapor pressure
$P_{water,res}$=pressure of the water in the reservoir
Q=volumetric flow rate
q"=heat flux
q"$_{subcooling}$=heat flux due to subcooling
$\Delta R$=electrical resistance change
R=electrical resistance
$R^2$=coefficient of determination
$R_c$=electrical connection resistance
$R_{total}$=total heater resistance
r=radius of curvature
$\Delta T$=temperature rise/temperature change
$\Delta T_{subcooling}$=subcooling
$T_1$=temperature measured by RTD1
$T_2$=temperature measured by RTD2
$T_3$=temperature measured by RTD3
$T_4$=temperature measured by RTD4
$T_{ave}$=average microchannel backside surface temperature
$T_{sat}$=saturation temperature
$T_{water,res}$=temperature of the water in the reservoir
U=input voltage from the power supply
u=velocity
$u_s$=superficial velocity
W=width of the microchannel
$W_c$=width of the electrical connection resistance
$W_{heater}$=width of the heater resistance
x=distance to the inlet of the microchannel
$\alpha^{-2}$=permeability
$\varepsilon$=porosity of micropillar arrays
$\theta_r$=receding contact angle
$\mu$=viscosity
$\sigma$=surface tension
$\chi$=vapor quality Other embodiments are within the scope of the following claims.

What is claimed is:

1. A structure comprising:
a fluid channel including an inlet, an outlet, and a flow therethrough,
a bottom wall, wherein the bottom wall includes an uncoated superhydrophilic surface and a plurality of microstructures, each of the plurality of microstructures having a height less than a height of the fluid channel; and
a side wall, wherein the side wall includes a surface that is coated with a hydrophobic material and a microscale roughness thereby promoting nucleation of vapor bubbles;
wherein when heat flux is applied to the fluid channel, a liquid film on the bottom wall is maintained and nucleation of boiling occurs only on the side wall, the boiling region including the hydrophobic material.

2. The structure of claim 1, wherein the plurality of microstructures are dimensioned to generate capillarity in the fluid channel.

3. The structure of claim 2, wherein the plurality of microstructures includes a micropillar.

4. The structure of claim 1, wherein the fluid channel includes Si.

5. The structure of claim 1, wherein the plurality of microstructures includes a hydrophilic material.

6. The structure of claim 5, wherein the hydrophilic material includes $SiO_2$.

7. The structure of claim 1, wherein the plurality of microstructures include Si.

8. The structure of claim 7, wherein the plurality of microstructures include a hydrophilic material.

9. The structure of claim 8, wherein the hydrophilic material is $SiO_2$.

* * * * *